(12) United States Patent
Murray et al.

(10) Patent No.: US 12,072,605 B2
(45) Date of Patent: Aug. 27, 2024

(54) APPARATUS FOR CONTROLLABLY STORING AND RELEASING PHOTONS

(71) Applicant: ORCA Computing Limited, London (GB)

(72) Inventors: Richard Murray, London (GB); Joshua Nunn, London (GB); Robert Francis-Jones, London (GB); Tom Parker, London (GB); Krzysztof Kaczmarek, London (GB)

(73) Assignee: ORCA Computing Limited, London (GB)

( * ) Notice: Subject to any disclaimer, the term of this patent is extended or adjusted under 35 U.S.C. 154(b) by 0 days.

(21) Appl. No.: 17/955,446

(22) Filed: Sep. 28, 2022

(65) Prior Publication Data
US 2023/0244121 A1    Aug. 3, 2023

(30) Foreign Application Priority Data

Jan. 31, 2022 (GB) ....................... 2201192

(51) Int. Cl.
*G02F 1/35* (2006.01)
*G01J 1/44* (2006.01)
(Continued)

(52) U.S. Cl.
CPC ............. *G02F 1/3526* (2013.01); *G01J 1/44* (2013.01); *G02F 1/3507* (2021.01); *G11C 13/04* (2013.01);
(Continued)

(58) Field of Classification Search
CPC ........ G02F 1/3507; G02F 1/3526; G01J 1/44; G01J 2001/442; G01J 1/42
See application file for complete search history.

(56) References Cited

U.S. PATENT DOCUMENTS 11,290,181 B1 * 3/2022 Meyers ............... H04B 10/70
2004/0109633 A1 * 6/2004 Pittman .............. G06N 10/00
385/16
(Continued)

FOREIGN PATENT DOCUMENTS

DE      10140542 A1 *  3/2003    ........... G02F 1/3517

OTHER PUBLICATIONS

United Kingdom Intellectual Property Office, Office Action, GB Patent Application No. 2201192.8, Sep. 9, 2022, six pages.

*Primary Examiner* — Jennifer D Bennett
*Assistant Examiner* — Erin R Garber
(74) *Attorney, Agent, or Firm* — Fenwick & West LLP

(57) ABSTRACT

An apparatus is disclosed herein. The apparatus comprises a non-linear photonic element for outputting a signal and idler photon pair. The apparatus further comprises a module configured to, based on receiving one or more control signals, controllably store photons and controllably output stored photons. The apparatus further comprises a detector arrangement comprising one or more detectors for detecting light. The module is further configured to receive at least one of the signal and idler photons of the pair. The module is further configured to at least partially store one of the signal or idler photons of the pair. The module is further configured to output the said at least partially stored signal or idler photon along an optical path towards the at least one detectors. The apparatus is configured to direct the other of the signal or idler photon towards the detector arrangement.

20 Claims, 18 Drawing Sheets

(51) Int. Cl.
*G11C 13/04* (2006.01)
*H04B 10/70* (2013.01)
(52) U.S. Cl.
CPC ........... *G11C 13/048* (2013.01); *H04B 10/70* (2013.01); *G01J 2001/442* (2013.01)

(56) References Cited

U.S. PATENT DOCUMENTS

| | | | |
|---|---|---|---|
| 2013/0089888 A1* | 4/2013 | Woodward | G01J 1/42 356/128 |
| 2013/0301333 A1* | 11/2013 | Gilbert | G11C 13/048 365/106 |
| 2014/0092467 A1* | 4/2014 | Chuu | G02F 1/39 359/330 |
| 2017/0075190 A1* | 3/2017 | Rudolph | G02F 1/3553 |
| 2022/0019409 A1* | 1/2022 | Bharadwaj | G06F 1/105 |

* cited by examiner

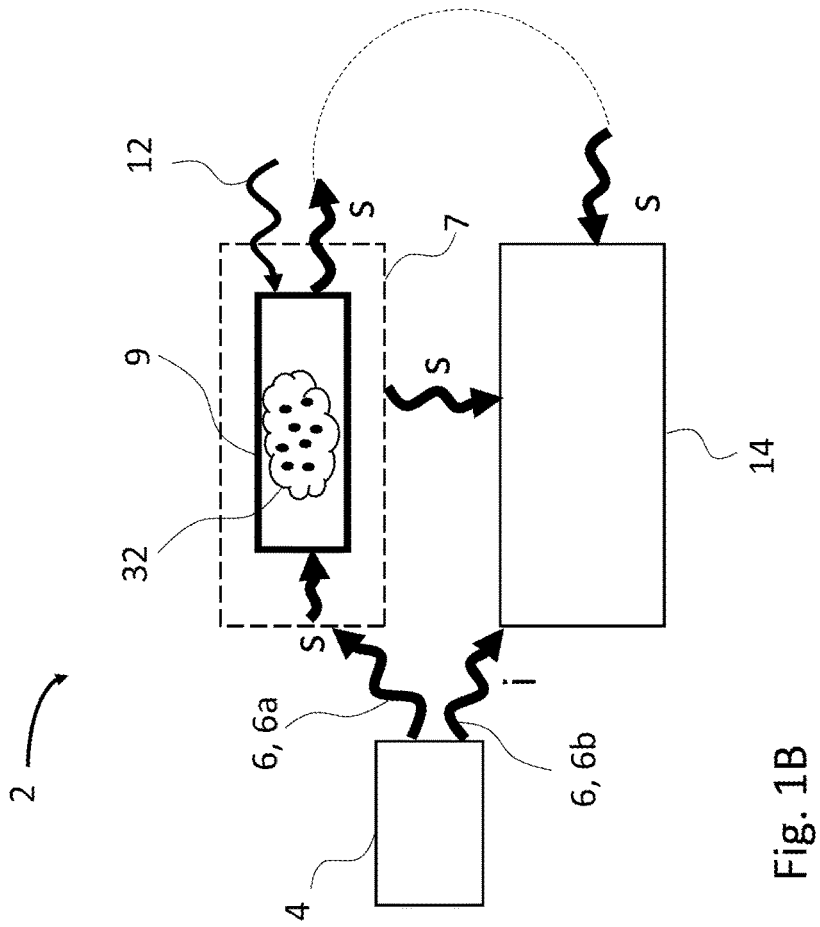
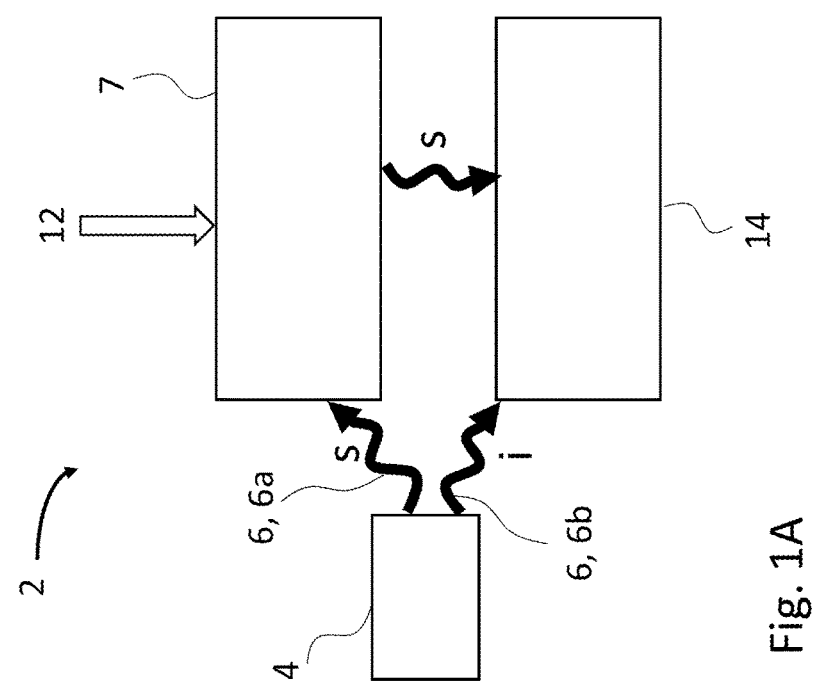
Fig. 1B
Fig. 1A

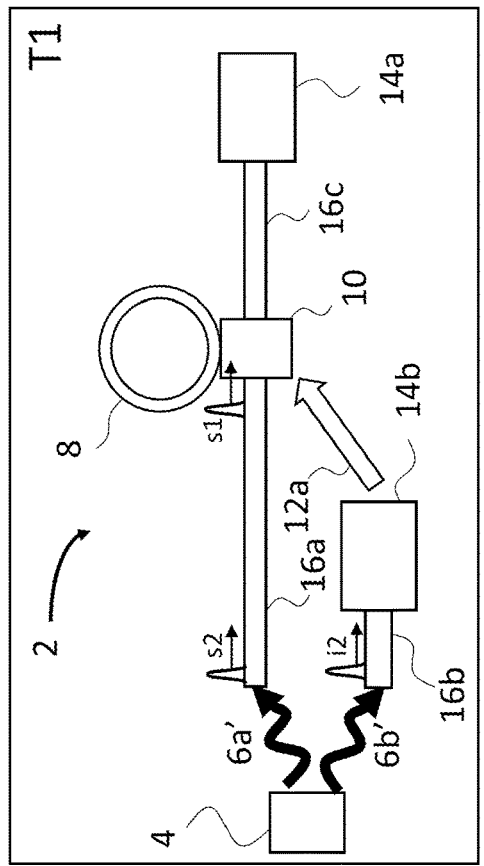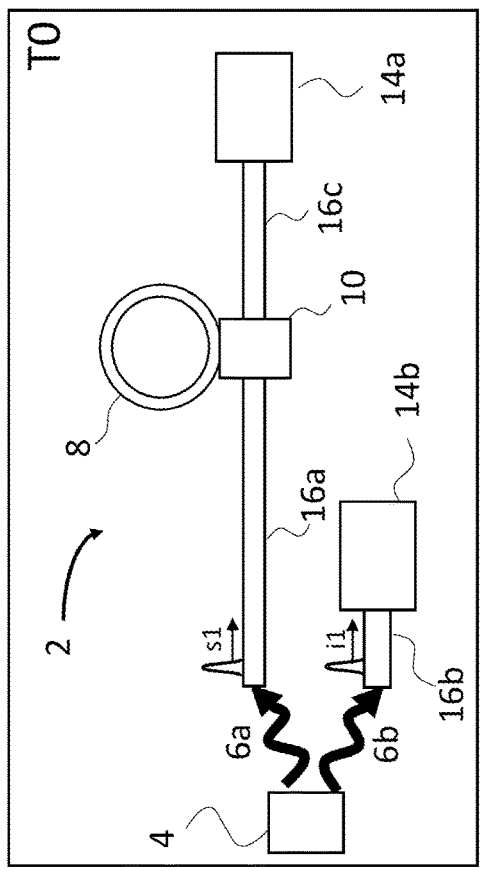

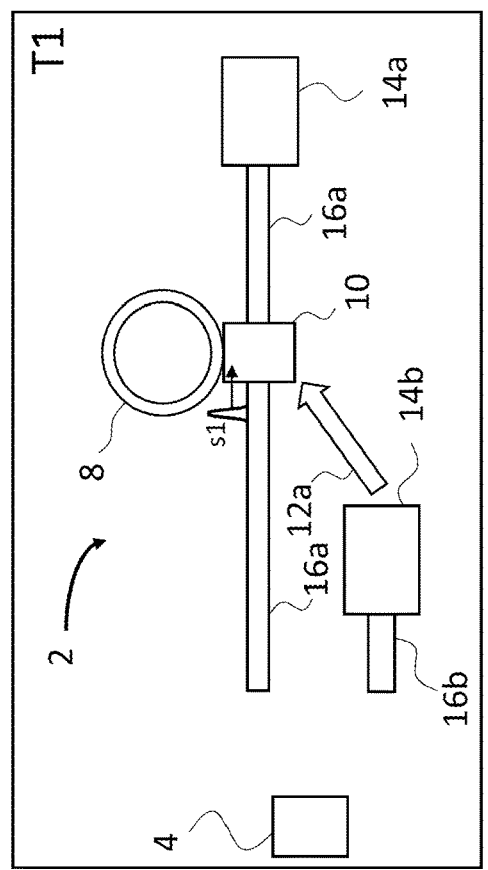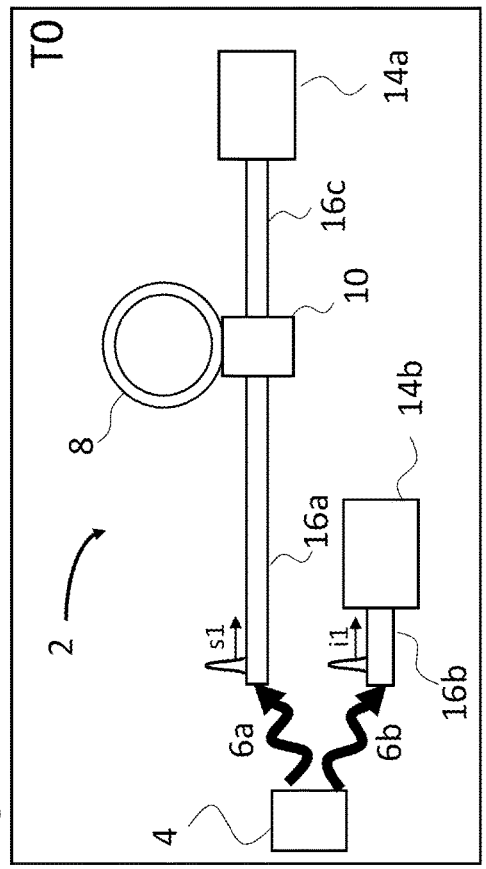

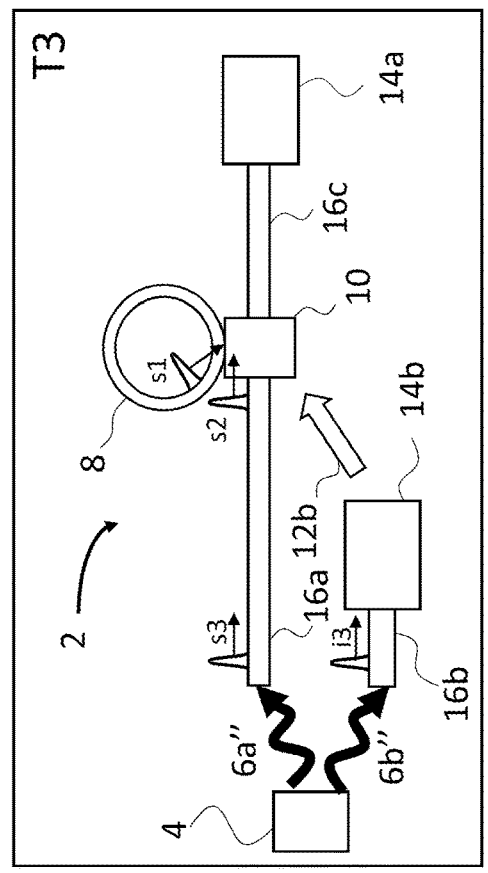
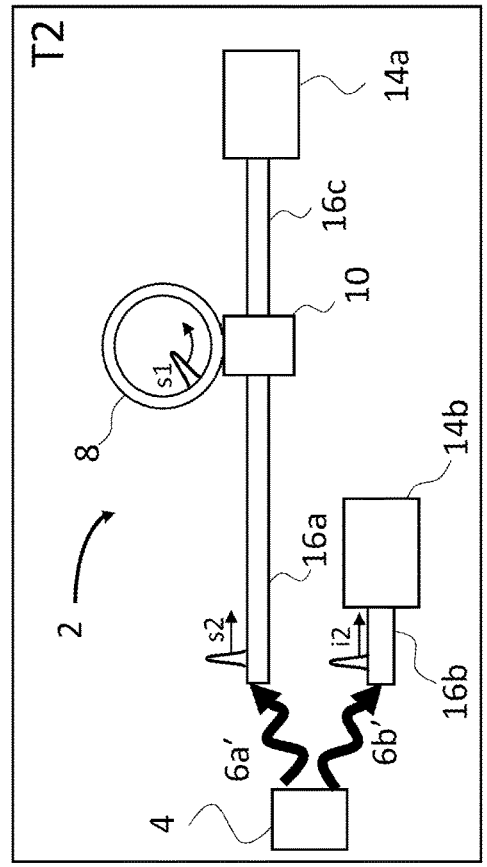

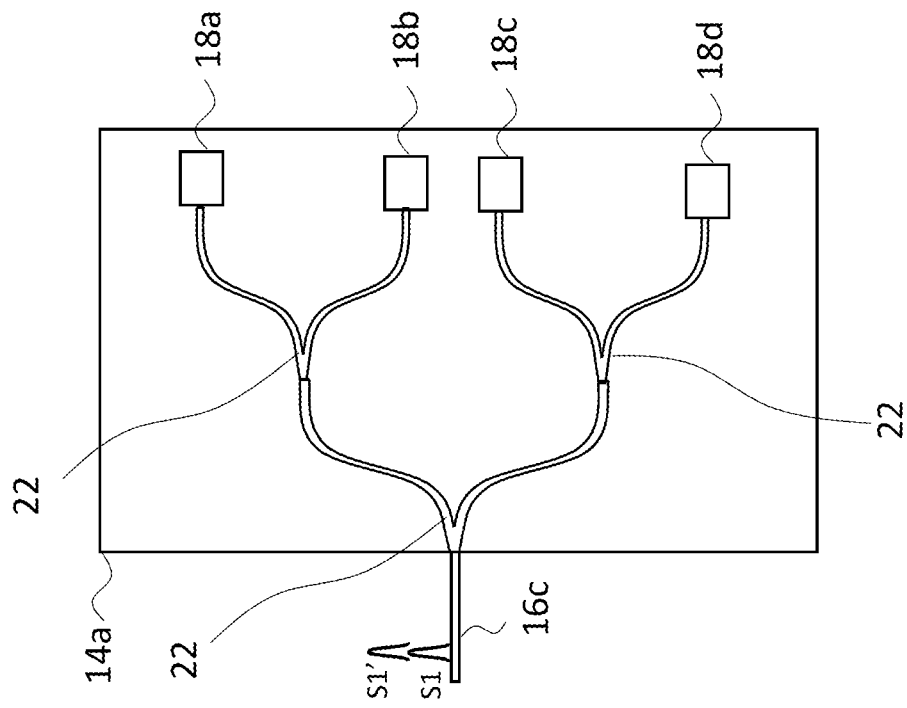
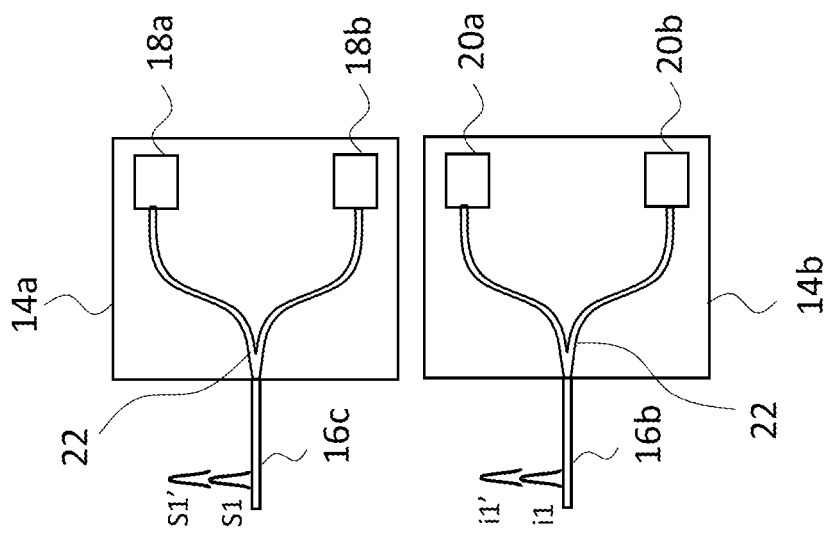

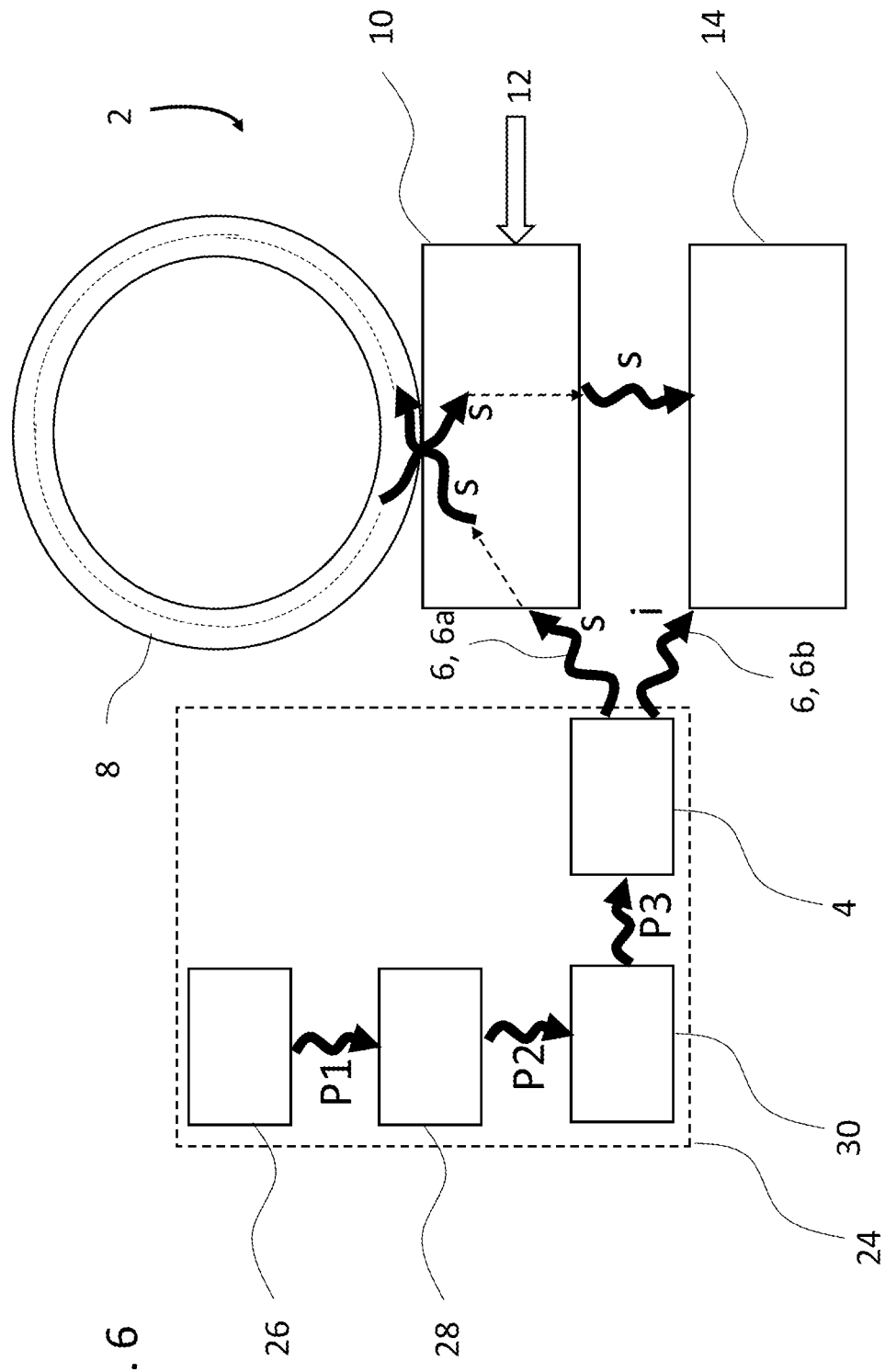

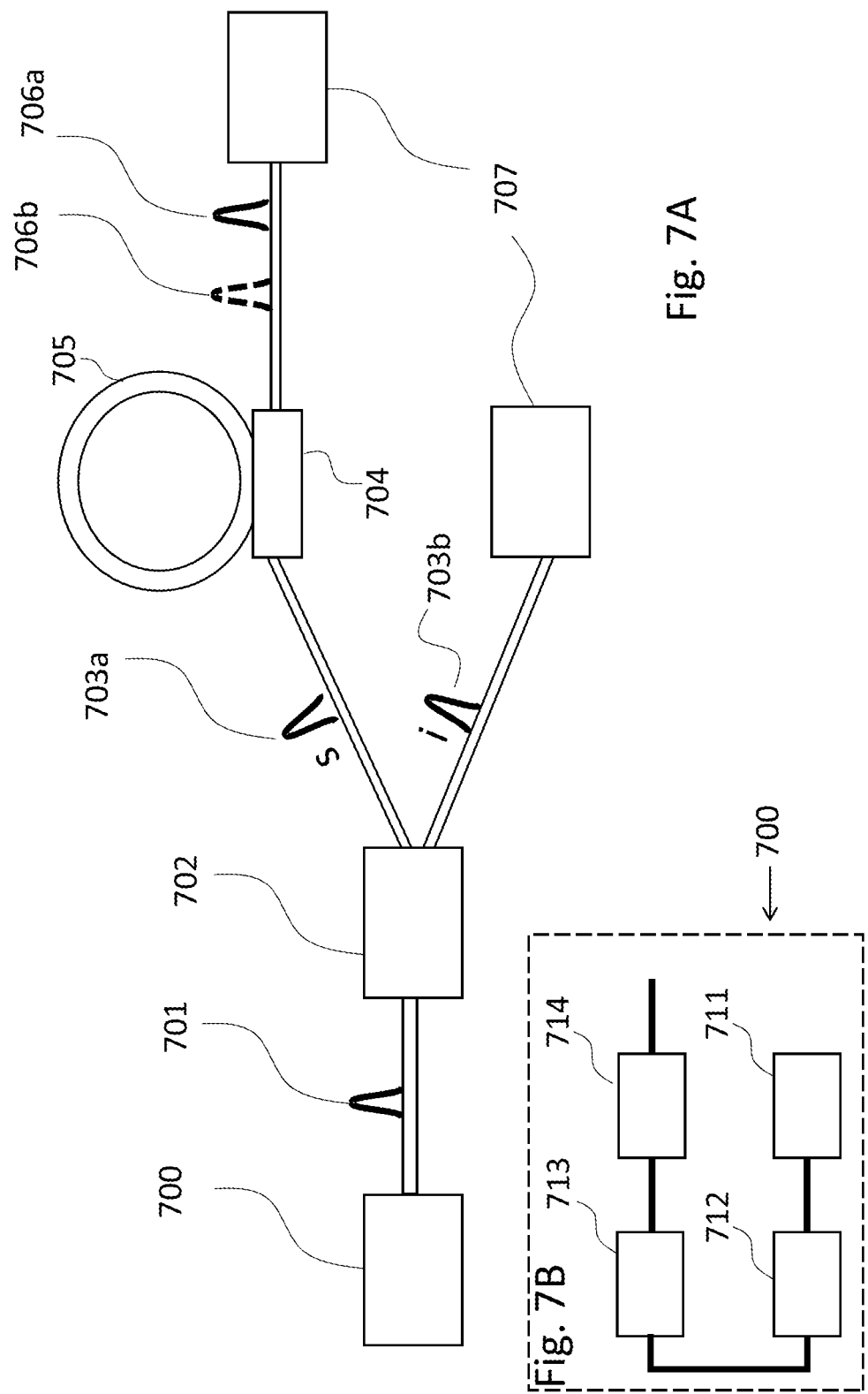

APPARATUS FOR CONTROLLABLY STORING AND RELEASING PHOTONS

CROSS-REFERENCE TO RELATED APPLICATION

This application claims priority to United Kingdom Application No. GB2201192.8, "Apparatus for controllably storing and releasing photons," filed on Jan. 31, 2022, which is hereby incorporated by reference in its entirety.

TECHNICAL FIELD

The present disclosure is in the field of controllably storing and releasing photons, including, but not limited to, optical fibre-based apparatus for doing the same.

BACKGROUND

Out of the many physical platforms conceivably available for quantum computing, photonic platforms are particularly promising. Photonic platforms can largely operate at room temperature, and often simple components, including beam splitters and phase shifters, in combination with photon detectors can be used to process the quantum information encoded in light. Such advantages make photonic platforms promising for near-term non-universal quantum computational paradigms such as boson sampling, in which a bosonic statistical distribution is sampled. Furthermore, photonic platforms enable fast gate operations compared to qubit decoherence time, fast readout (measurements) and efficient qubit transfer. Accordingly, photonic platforms are also a promising candidate for universal quantum computation, and in particular measurement-based quantum computing.

However, one problem commonly arising in photonic quantum systems is that many crucial operations, including single photon generation, are probabilistic. Furthermore, photon loss leads to errors, particularly in systems involving large numbers of components. To mitigate such issues, it is useful to have methods and apparatuses for controllably storing and releasing photons.

It is an object of embodiments of the disclosure to at least mitigate one or more of the problems of the prior art.

SUMMARY

According to an aspect of the disclosure, an apparatus is provided. The apparatus comprises a non-linear photonic element for outputting a signal and idler photon pair. The apparatus further comprises a module configured to, based on receiving one or more control signals, controllably store photons and controllably output stored photons. The apparatus further comprises a detector arrangement comprising one or more detectors for detecting light. The module is further configured to receive at least one of the signal and idler photons of the photon pair. The module is further configured to at least partially store one of the signal or idler photons of the pair. The module is further configured to output the said at least partially stored signal or idler photon along an optical path towards at least one of the detectors. The apparatus is configured to direct the other of the signal or idler photon towards the detector arrangement.

Many modifications and other embodiments of the disclosure set out herein will come to mind to a person skilled in the art in light of the teachings presented herein. Therefore it will be understood that the disclosure herein is not to be limited to the specific embodiments disclosed herein. Moreover, although the description provided herein provides example embodiments in the context of certain combinations of elements, steps and/or functions may be provided by alternative embodiments without departing from the scope of the disclosure.

BRIEF DESCRIPTION OF THE DRAWINGS

Embodiments will now be described by way of example only, with reference to the accompanying figures, in which:

FIG. 1A shows a schematic example of an apparatus for controllably storing and releasing photons;

FIG. 1B shows a further schematic example of an apparatus for controllably storing and releasing photons, using quantum memory;

FIGS. 3A-3D show a further example of using an apparatus of FIG. 1C to store two signal photons in a loop;

FIGS. 4A-4F show an example of using an apparatus of FIG. 1C to store signal photons in a loop, and to interfere said photons;

FIGS. 5A and 5B show alternative detector arrangements for use with an apparatus;

FIG. 6 shows an example of an apparatus similar to FIG. 1C further comprising an optical source system;

FIG. 7A shows an example of an apparatus with a pulse source system;

FIG. 7B shows the pulsed source system of FIG. 7A;

Throughout the description and drawings, like reference numerals refer to like parts.

DESCRIPTION

Figure 1C:
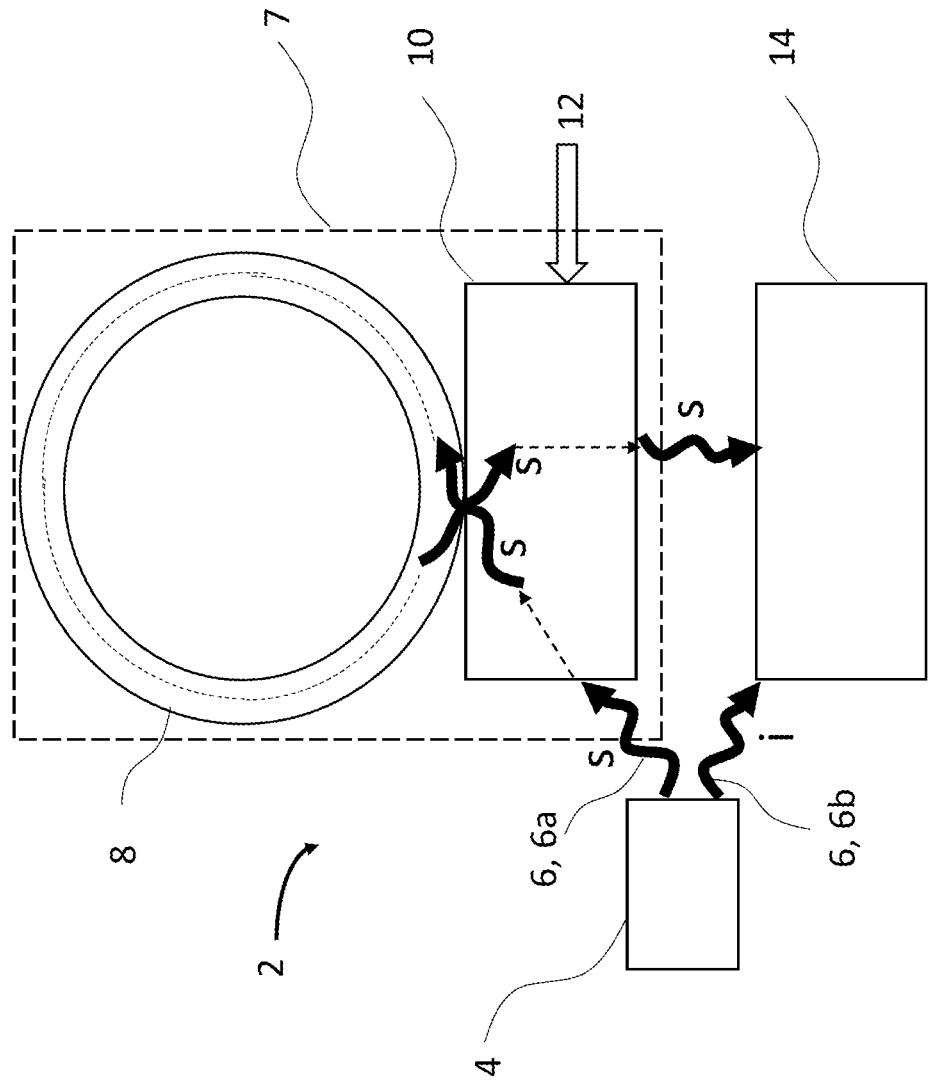
FIG. 1C shows a schematic example of an apparatus for controllably storing and releasing photons.

The present disclosure provides novel/improved methods for controllably storing and releasing photons, and appropriate apparatuses and devices for performing said methods. Said apparatuses are also, in various embodiments, suitable for interfering photons emitted by a source in different time bins/time slots, and for generating entangled states. Whilst various embodiments are described below, the disclosure is not limited to these embodiments, and variations of these embodiments may well fall within the scope of the invention which is to be limited only by the claims.

Several apparatuses are presented herein capable of controllably storing and releasing photons. According to one embodiment, an apparatus comprises a non-linear photonic element for outputting a signal and idler photon pair. The apparatus comprises a module configured to, based on receiving one or more control signals, controllably store photons and controllably output stored photons. The apparatus comprises a detector arrangement comprising one or more detectors for detecting light. The module is further configured to receive at least one of the signal and idler photon of the photon pair. The module is further configured to at least partially store one of the signal or idler photons of the pair. The module is further configured to output the said at least partially stored signal or idler photon along an optical path towards at least one of the detectors. The apparatus is configured to direct the other of the signal or idler photon towards the detector arrangement.

The wording "at least partially stored" is to be understood generally to mean that the photon is stored deterministically or probabilistically, or that at least one quantum state of the photon is stored. Examples are provided further below. In some examples, the one of the signal 6a or idler 6b photon may be deterministically stored. In other examples, the one of the signal 6a or idler 6b photon may be probabilistically stored—that is, the photon may be placed into a superposition of being "stored" and "not stored". In other examples, a quantum state of the one of the signal 6a or idler 6b photon is stored—for example, a photon may be received in a superposition of two orthogonal polarization states, with one polarization state being "stored" and the other polarization state being "not stored". Examples of at least partially storing a photon are presented in some examples described herein.

As will be appreciated by the skilled person, the apparatuses herein may be suitable for many different purposes. The apparatuses herein are suitable for controllably storing and releasing photons. Some embodiments described herein are suitable for boson sampling. A boson sampler is a type of non-universal quantum computer. In boson sampling, one generates an input bosonic state (for example a photonic state comprising a plurality of photons), applies a transformation to that input bosonic state (for example, by sending the photons through a linear interferometer), and samples from the output distribution. The measurements performed are typically based on the number of bosons in each output mode. For a given input state, one can with repeated operations of the boson sampler build up an empirical probability distribution of bosonic configurations of the output state. Some embodiments described herein are suitable for cluster state generation. Cluster states are a type of highly entangled state of multiple qubits, that are particularly useful for measurement-based quantum computing (MBQC). Other uses for the apparatuses described herein include quantum random number generation.

An example of an apparatus 2 is shown in FIG. 1A. The apparatus 2 comprises a non-linear photonic element 4 for outputting a signal 6a and idler 6b photon pair 6. The apparatus 2 further comprises a module 7 configured, based on one or more control signals 12, to controllably store photons and controllably output stored photons. The apparatus 2 further comprises a detector arrangement comprising one or more detectors 14 for detecting light.

The module 7 is further configured to receive at least one of the signal 6a or idler photons 6b of the photon pair 6. The module 7 is further configured to at least partially store one of the signal 6a or idler 6b photons of the photon pair 6. The module 7 is further configured to output the said at least partially stored signal 6a or idler 6b photon towards at least one of the detectors of the detector arrangement 14. The apparatus 2 is configured to direct the other of the signal 6a or idler 6b photon towards the detector arrangement 14.

The module 7 may take various forms. In FIG. 1B, a first example is shown. Specifically, the module 7 of FIG. 1B comprises a photonic memory element 9. This memory element 9 may be a quantum memory. The memory element may be, for example, an atomic ensemble 32 accommodated within a waveguide such as an integrated optic waveguide or optical fibre. The quantum memory may controllably store and release stored photons using a photonic control signal 12 as shown in FIG. 1B. The quantum memory may be a rubidium based quantum memory.

In other examples, the module 7 may also take the form of a looped path, for example an integrated optic loop, a bulk optic free space-based loop or an optical fibre loop.

Many of the following examples underneath describe the module 7 having a looped path, however the teachings of any of the examples below may be equally applied to modules 7 using other features to controllably at least partially store photons, such as the quantum memory described above. These teachings may include, but are not limited to, any of: the overall set up and additional components described for the apparatus 2 in the examples, the configurations of detectors, the source of the photon pairs, the nature of the control signals 12, any feedback mechanisms and any method of using the apparatus 2.

FIG. 1C shows an example of an apparatus 2 that includes a looped path 8. More particularly, the apparatus 2 comprises a non-linear photonic element 4 for outputting a signal 6a and idler 6b photon pair 6 (the signal photon 6a is labelled with an "s", whilst the idler photon is labelled with an "i"), a detector arrangement 14 for detecting light, and a module 7 comprising a looped path 8 for guiding photons and a photonic element 10.

The module 7 is configured to receive at least one of the signal 6a or idler 6b photons of the photon pair 6. In FIG. 1C, this is shown by the photonic element 10 receiving the signal photon 6a, but in principle the photonic element 10 may also receive the other photon of the pair 6, which in the example of FIG. 1C is the idler photon 6b.

The module 7 is further configured to at least partially couple the signal photon 6a or idler photon 6b into the looped path based on one or more control signals 12. In FIG. 1C, the signal photon 6a is shown to be completely coupled or routed into the looped path 8, but the skilled person will appreciate that this may not be the case.

The wording "at least partially coupled into" is to be understood generally to mean that the photon is coupled into the loop deterministically or probabilistically, or that at least one quantum state of the photon is coupled into the looped path 8. In some examples, the photon may be deterministically routed into the looped path 8 if the photonic element 10 comprises a routing device such as a switch, that can be controlled by control signals 12 to switch the photon completely into the looped path 8, and that can be controlled by control signals 12 to switch the photon completely out of the looped path along the optical path towards the detector arrangement 14. In some examples, the photon may be probabilistically routed into the looped path such that the photon is placed into a superposition of being coupled into the looped path 8 and not coupled into the looped path—for example, the photonic element 10 may comprise a reconfigurable beam splitter having a reconfigurable effective reflection coefficient, one output of which is directed into the looped path 8 and the other output port of which is directed along an optical path towards the detector arrangement 14. Such probabilistic coupling enables the apparatus to generate quantum states comprising a quantum superposition of spatiotemporal configurations (that is, a photon may be found in a particular time bin, or may be found in a subsequent time bin if stored and subsequently released). In some examples, at least partially coupling the photon into the looped path 8 may comprise coupling one quantum state into the looped path. As an example, the photonic element 5 may comprise a polarizing beam splitter for coupling one polarization state into the looped path 8 and for coupling an orthogonal polarization state along the optical path towards the detectors such that if the received photon is in a superposition of the one polarization state and the orthogonal polarization state, then the photon will be placed in a superposition of being "stored" in the looped path 8 or "not stored" in the looped path 8.

A path of the signal photon 6a in FIG. 1C is shown in dotted lines. This dotted line path is not intended to represent an actual physical path, but merely to show how the signal photon 6a may be directed between different components by the photonic element 10.

The module 7 of FIG. 1C is further configured to at least partially couple the said signal or idler photon out of the looped path along the optical path towards at least one detector of the detector arrangement 14. In the example of FIG. 1C, the signal photon 6a is shown to have taken a full circulation around the looped path 8 before being coupled out of the looped path 8. The apparatus 2 is also configured to direct the other of the signal 6a or idler 6b photon towards the detector arrangement 14. In the example of FIG. 1C, the idler photon 6b is output from the non-linear element 4 towards the detector arrangement 14 without passing via the photonic element 10.

In the example of FIG. 1C, the idler photon 6b is directed by the apparatus 2 towards the detectors 14, however in principle the idler photon 6b may be the photon of the pair 6 that is coupled into the looped path 8 whilst the signal photon 6a is directed towards the detector arrangement 14 without going around the looped path 8. Furthermore, the photon 6a, 6b input into the looped path 8 may circulate around the loop once or a plurality of times before being output from the looped path 8. In the following examples underneath the signal photon 6a will be the photon being coupled into/out of the looped path 8 and the idler photon 6b will be the photon that does not get coupled into the looped path 8 by the photonic element 10, although either photon of the pair 6 may perform either role.

In other words, the apparatus 2 may generate a photon pair 6 and controllably couple one of the photons into a circulating looped path 8/delay line and controllably couple the photon out again. This control is facilitated by control signals 12 that control the photonic element 10 to selectively couple the photon into the loop 8 or out of the loop 8. The photonic element 10 and control signals 12 may be configured to work together such that the photonic element 10 couples photons into/out of the loop with non-binary certainty. Both of the signal and idler photons 6a, 6b of the pair 6 may therefore by input to the plurality of detectors 14 with one of the photons being controllably delayed around the loop 8 for a single loop round trip or multiple loop round trips. This may be advantageous if one seeks to delay the arrival of one of the photon pair 6 with the other. For example, if both of the photons 6a, 6b are being detected by the same detector, the control signal 12 can be used to delay the signal photon 6a so that the detector can recover from detecting the idler photon 6b before it detects the signal photon 6a. This may be particularly useful if the detector deadtime changes. In another example the detection of the idler photon 6b results in a detection signal (such as an electrical signal) that can be used, for example by an electronic processor or other controller (not shown in the figure), to generate a control signal 12 used to control the module 7 to store or release the signal photon 6a. In FIG. 1C the control signal is used to drive the photonic element 10 to couple in or out the signal photon 6a from the loop 8 or keep the signal photon 6a propagating around the loop 8.

The detection of the idler photon 6b may be used to feedback, via a control signal 12, to control any of: the input into the loop 8 of the corresponding signal photon 6a of the same pair, the output of the corresponding signal photon 6a from the loop or the continued circulation of the corresponding signal photon 6a in the loop 8 (e.g., making the signal photon 6a stay in the loop 8 for another loop round trip).

Feedback from detecting either the idler photon 6b, signal photon 6a, or both 6, may also be used to generate a control signal 12 to drive the module 7 into storing or releasing a further signal/idler photon. For example, causing the photonic element 10 to couple in or out a further signal/idler photon. The further signal/idler photon pair may be emitted from the non-linear photonic element 4, for example after the emission of the initial photon pair 6.

In other words, at least one detector of the plurality of detectors 14 may be configured, upon receiving and detecting the signal or idler photon output from the looped path 8, to output a detection signal. The apparatus 2 may be configured to output a further signal and idler photon pair from the non-linear photonic element 4. The apparatus 2 may be configured to control, based on at least one of the at least one control signals 12, at least one of the: a) at least partial coupling of one of the further signal or idler photons into the looped path 8; b) at least partial coupling of one of the further signal or idler photons out of the looped path 8. The control signal 12 is based, in this example, on the detection signal. For purposes of discussion the abovementioned signal 6a and idler 6b photons of the pair 6 are referred to as the signal and idler photons of the first pair 6 whilst the further pair may be referred to as the second pair. Other pairs after second pair may be equivalently referenced, e.g. the third pair etc.

The module may receive different photon pairs from different photon sources, however for purposes of discussing examples herein, it is assumed that each photon pair 6 is emitted from the same non-linear photonic element 4 to help ensure that that successive photons are indistinguishable from each other when overlapped in time and space. The emission of photon pairs from the non-linear photonic element 4 may be confined to particular time-bins set by how the non-linear photonic element 4 is driven, for example by a repetition rate of a pump pulse source (also referred to herein as a 'pulsed source system'). Details about this are discussed elsewhere herein. The emission of a photon pair 6 within a time bin may be deterministic or non-deterministic.

Figure 2A:
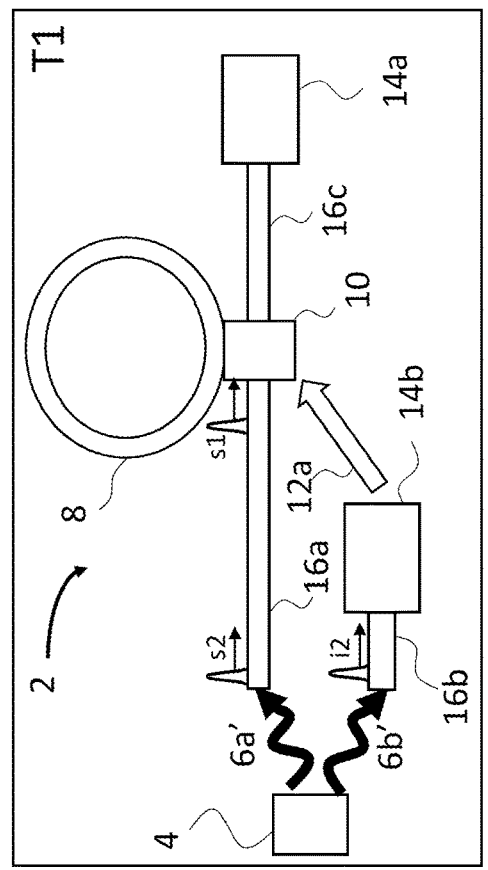
FIGS. 2A-2D show an example of using an apparatus of FIG. 1C to store two signal photons in a loop.

FIGS. 2A-2D show an example of using an apparatus 2 such as that of FIG. 1C to store two signal photons s1 and s2 in the loop 8. Each of the FIGS. 2A-2D represent different sequential points in time beginning at T0 and ending at T3. In FIG. 2A, at time T0, the non-linear photonic element 4 emits a first photon pair 6a and 6b. The signal photon 6a is input into a first optical fibre 16a and is schematically shown as signal photon mode s1 travelling towards the photonic element 10 and a first set of one or more detectors 14a. The idler photon 6b is input into a second optical fibre 16b and is schematically shown as idler photon mode i1 travelling towards a second set of detectors 14b. FIGS. 2A-2D use optical fibre paths to guide photons towards different components, however in this example, and indeed any other examples herein, other optical paths may be used including free space using bulk optic components, integrated optic waveguides and any combinations thereof.

Figure 2B:
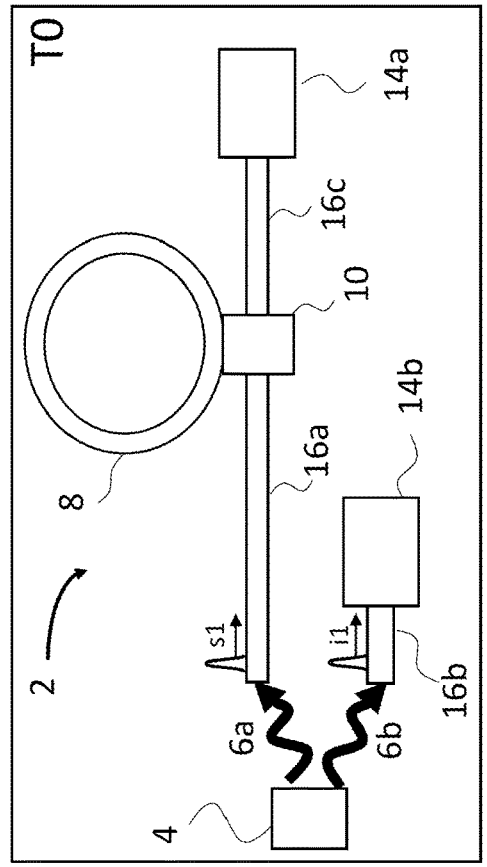

In FIG. 2B, at time T1 (after T0), the first signal photon s1 has travelled along the first fibre 16a and is incident upon the photonic element 10. The first idler photon i1 has been detected by a detector of the second set of detectors 14b giving rise to an electronic signal used as a control signal 12a that is sent to the photonic element 10 to switch the incoming first signal photon s1 out of the first fibre 16a and into the loop 8. The first idler photon i1 is therefore detected and the control signal 12a output before the first signal photon s1 enters the photonic element 10. At the same time, the non-linear photonic element 4 has emitted a second photon pair having a signal photon 6a' and a second idler photon 6b'. These photons have been correspondingly input into the first fibre 16a and second fibre 16b and travel as modes s2 and i2, respectively. The skilled person will appreciate that in other examples the photonic element need not be controlled based on the detection of an idler photon—for example, the photonic element may be controlled (using control signals) according to a pre-determined pattern, and the idler and signal detections (or lack thereof) can be post-processed to determine the result of a computation.

Figure 2C:
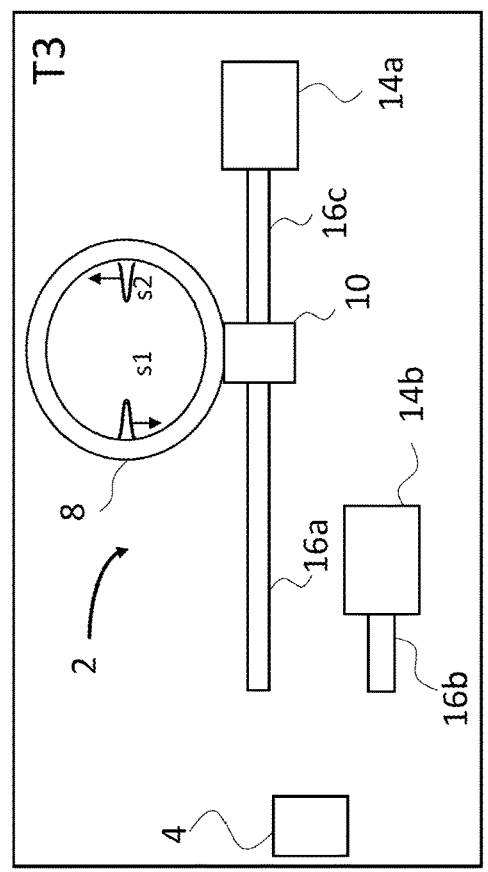

In FIG. 2C, at time T2 (after T1), the first signal photon s1 is propagating within the loop 8. The second signal photon s2 has travelled along the first fibre 16a and is incident upon the photonic element 10. The second idler photon i2 has been detected by a detector of the second set of detectors 14b giving rise to an electronic signal used as a control signal 12b that is sent to the photonic element 10 to switch the incoming second signal photon s2 out of the first fibre 16a and into the loop 8.

Figure 2D:
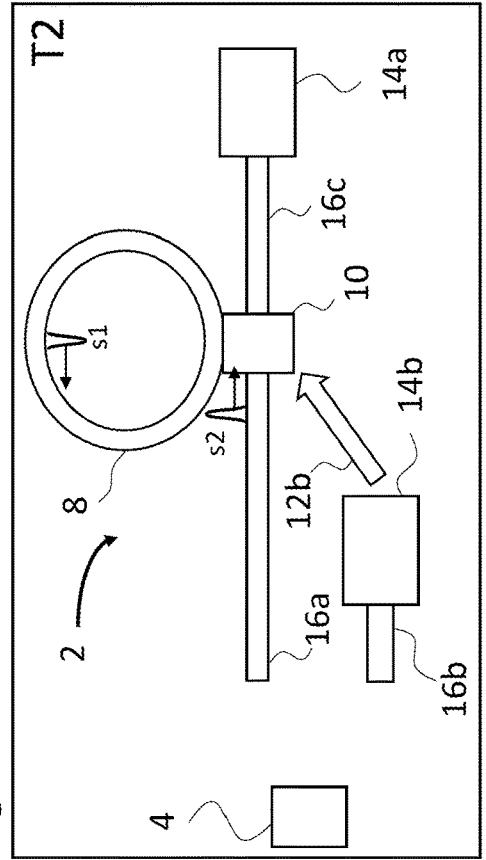

In FIG. 2D, at time T3 (after T2), both the first signal photon s1 and the second signal photon s2 are propagating in the loop 8. Thus, the apparatus 2 in this example has used the idler photon 6b, 6b' of each photon pair 6 to switch its corresponding signal photon 6a, 6a' into the loop 8. The signal photons 6a, 6a' may continue propagating around the loop 8 until a further control signal (not shown) is provided to the photonic element 10 to switch them out of the loop 8 and towards the first set of detectors 14a along an optical fibre path 16c. If the detectors 14b do not detect an idler photons i1, i2, then no control signals are generated and the photonic element 10 is not made to switch light into the loop 8. In the example shown in FIGS. 2A-2D, the round-trip time of the loop 8 is larger than the time delay (hence repetition rate) between the emission of successive photon pairs 6, however the loop optical path length, hence loop transit time, may be set to be the same as or shorter than the photon pair emission repetition rate. Additionally, or alternatively, in any of the examples herein, the rate at which photon pairs 6 are emitted from the non-linear photonic element 4 may be controllably varied, for example tuned to have the same, or substantially similar time delay between photon pairs 6 as the loop transit time.

Advantageously, an apparatus such as that described in relation to FIGS. 2A-2D can be used to controllably store and release photons. The apparatus can be used as a form of quantum memory or buffer.

Figure 3C:
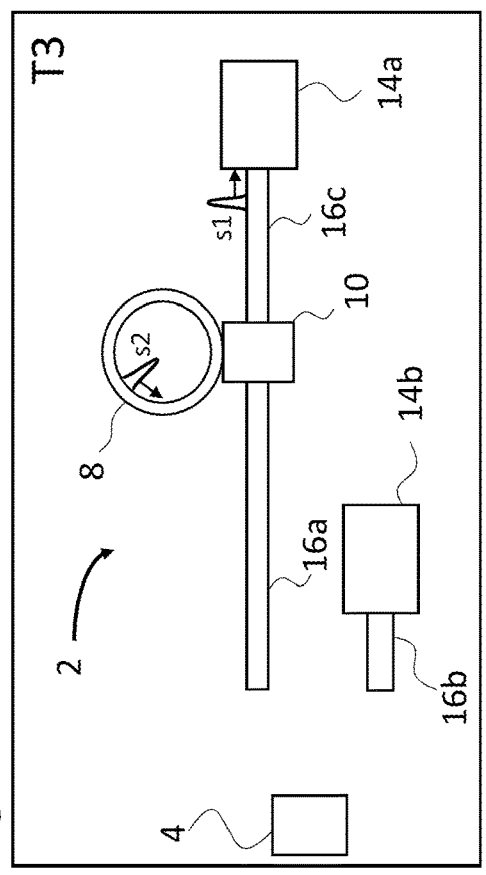
Figure 3D:
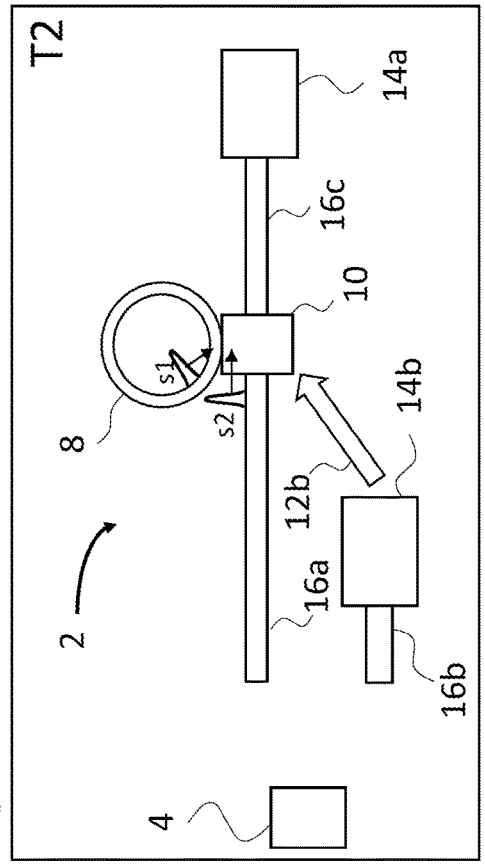

FIGS. 3A-3D show an example of using an apparatus 2 such as that of FIG. 1C to store one photon at a time in the looped path 8. In this example the loop length of the loop 8 is smaller than that of the loop 8 of FIGS. 2A-2D such that the loop transit time (e.g., the time taken for a signal photon to enter the loop 8, make a single traversal of the loop 8 and arrive back at the point at which it was previously switched in) is substantially the same as the time between emission of successive photon pairs 6. The actions occurring in FIGS. 3A and 3B are substantially the same as those of FIGS. 2A and 2B respectively. In FIG. 3C, at time T2 (after T1), however the second signal photon s2 is incident upon the photonic element 10 at the same time the first signal photon s1 is incident upon the photonic element 10 having completed a single traversal of the loop 8. The control signal 12b that causes, via controlling the photonic element 10, the second signal photon s2 to couple into the loop 8 from the first fibre 16a also causes the first signal photon s1 to couple out of the loop 8 into the fibre 16c (which may be the same as fibre 16a) and travel towards the first detector 14a. FIG. 3D, at time T3, shows the first signal photon s1, having been coupled out of the loop 8, travelling along the optical path 16c and incident upon the first set of detectors 14a, whilst the second signal photon s2 is continuing to traverse the loop 8 in its first circulation.

Thus, in this example the same control signal 12b is used to affect the storing or coupling out of storage, multiple photons originating from different time bins. In this example the photonic element may be, for example, a photonic switch or variable/reconfigurable beam splitter that can cause light to either: a) be fully coupled across from the loop 8 to the fibre 16c; or b) stay in the path it is currently on (e.g., stay in the loop 8 or continue propagating along the first fibre 16a/16c). These options may be referred to as a 'reflection mode' when photons are coupled between the loop 8 and first fibre 16a and a 'transmission mode' for when photons continue along the same optical path. In this example, the photonic element 10 is set to transmission mode (e.g., not coupling photons between the first fibre 16a and the loop 8) without a control signal 12 and couple photons across in reflection mode with a control signal 12, however other implementation settings may be possible. In the above examples of FIGS. 2A-2D and 3A-3D the photonic element 10 is set to either fully (deterministically) couple a photon from the first fibre 16a to the loop 8 or not.

Figure 4E:
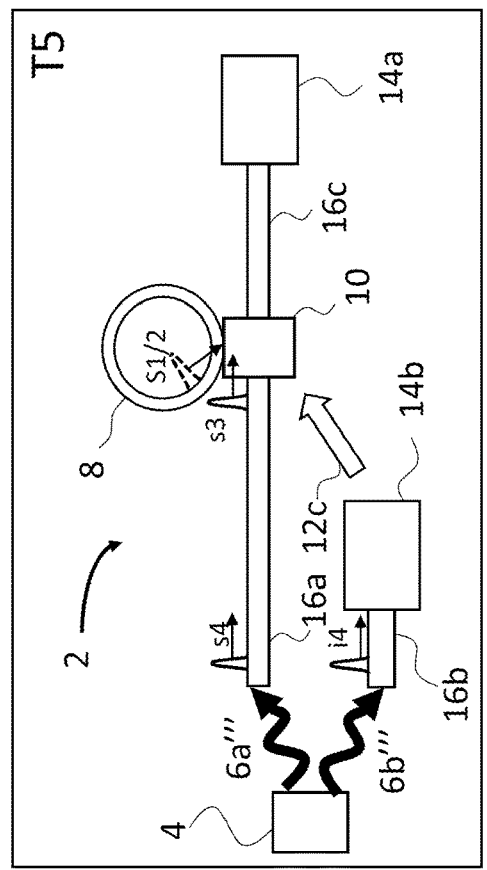

FIGS. 4A-4F illustrate another example of using an apparatus 2 such as that of FIG. 1C. In this example the photonic element 4 may cause photons to be partially coupled into or out of the loop 8 with a less than 100% probability. FIGS. 4A and 4B are similar to FIGS. 3A and 3B except that the non-linear photonic element 4 does not output a second photon pair at T1. At time T2, as shown in FIG. 4C the first signal photon s1 has completed its first traversal of the loop 8 and is incident upon the photonic element 10. At this same time the non-linear photonic element 4 has output a second photon pair such that second signal photon 6a' and second idler photon 6b' couple into first and second fibres 16a, 16b and propagate respectively as optical modes s2, i2. The photonic element 10 is not provided with a control signal 12 to switch to reflection mode, therefore it stays in transmission mode such that the first signal photon s1 continues to propagate around the loop 8 for a second time.

In FIG. 4D, at time T3 (after T2), the first signal photon s1 has completed its second traversal around the loop 8 whilst the second signal photon s2 has propagated along the first fibre 16a to be incident upon the photonic element 10 at the same time as the first signal photon s1 is also incident upon the photonic element via the loop 8. The second idler photon i2 has been detected by a detector of the second detector set 14b and a resulting second electronic control signal 12b has been generated and input into the photonic element 10 to cause it to change from transmission mode into another mode of operation. The non-linear photonic element has also emitted a third photon pair having a third signal photon 6a" entering the first fibre 16a and propagating as a signal mode s3; and a third idler photon 6b" entering the second fibre 16b and propagating as an idler mode i3. In this example, however the second control signal 12b causes the photonic element 10 to be set in a mode of operation in-between full reflection and transmission, for example 50% reflection and 50% transmission (or '50/50'). Other transmission/reflection ratios may also be used, but in this example a 50/50 ratio is exemplified. As a result of the photonic element 10 probabilistically coupling the signal photons s1 and s2 between the loop 8 and the first fibre 16a, the signal photons s1 and s2 interfere. The result of the interference being shown in FIG. 4E, at time T4, wherein a first interfered superposition s1/2 of the signal photons s1, s2 propagates along the optical fibre 16c towards the first set of detectors 14a, whilst another interfered superposition s1/2 of the same signal photons s1, s2 continues to propagate within the loop 8. At the same time, T4, the third signal photon s3 has propagated along the first fibre 16a towards the photonic element 10 and the third idler photon i3 is being detected by one of the detectors of the second detector set 14b.

Figure 4F:
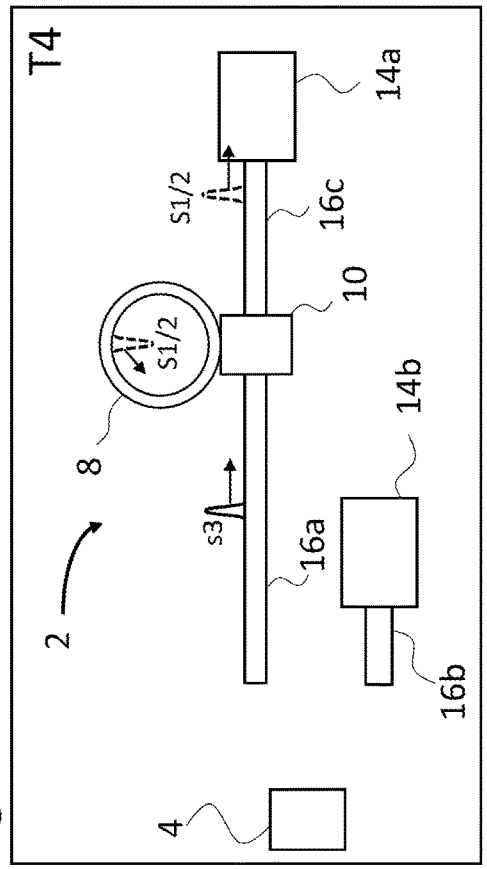

FIG. 4F shows, at time T5 (after T4), the signal photon superposition s1/2 completing its round-trip of the loop 8 and being incident upon photonic element 10. The non-linear optical element 4 has output a fourth photon pair 6a''', 6b''' giving rise to signal mode s4 and idler mode i4. The third signal photon s3 is also incident upon the photonic element 10. The control signal 12c generated from the detection of the third idler photon i3 is input to the photonic element 10 to control its mode of operation. This mode of operation may be any of those mention previously including: a) full (deterministic) transmission mode wherein superposition s1/2 continues along the loop 8 and third signal photon s3 bypasses the loop 8 and travels towards the first detector set 14a; b) full (deterministic) reflective mode wherein superposition s1/2 couples out of the loop 8 and travels towards the first detector set 14a whilst third signal photon s3 enters the loop 8; c) partial (probabilistic) reflection/transmission mode whereby the signal photon superposition s1/2 interferes with third signal photon s3.

Advantageously, an operation of the apparatus as described in relation to FIGS. 4A-4F can be used to controllably store and release photons and to controllably interfere photons in different spatiotemporal modes to generate non-classical quantum states. Advantageously, such quantum states can be used for example in boson sampling.

In the example shown in FIGS. 4A-4F, the control signals 12 can be used to continually store signal photons in the loop if a photon pair 6 has not been emitted in a time bin. Furthermore, the control signals 12 can be used to selectively interfere signal photons 6a existing in different time bins.

The probabilistic nature of interfering signal photons may lead to a time bin having, upon detection, multiple signal photons 6a. In certain applications it is useful to differentiate between a time bin having one photon or multiple photons or being able to resolve how many photons are in the time bin. This may be for both the signal photons 6a and the idler photons 6b. FIG. 5A shows the first set of detectors 14a and second set of detectors 14b each have two photonic detectors for detecting photons. The first set of detectors 14a comprises detectors 18a and 18b and an optical intensity splitter 22, also referred to as a 'splitter'. The splitter 22 of detector set 14a has an optical input for receiving the signal photons and two optical outputs. Each optical output inputs light into a different one of the detectors 18a, 18b. The splitter 22 in this example has 50/50 intensity splitting ratio, however other splitting ratios may also be used. The splitter 22 may be formed from any of: optical fibre components, integrated optic components and free space bulk optic components. The splitter (or concatenation of splitters 22 in the example of FIG. 5B) may be part of the detector set 14a, as shown in FIG. 5A, for example being integrated with the detectors 18a, 18b. Alternatively the splitter may be separate to the detector set 14a, for example being optical fibres that are couplable to the detectors 18a/18b. In FIG. 5A, there are two signal photons s1 and s1' that are incident into an input of the splitter 22. In this example there is just one input optical path, but there may be more than one in other examples. The splitter 22 acts to provide a probability that the two signal photons s1, s1' are routed to different detectors, for example s1 is routed to detector 18a whilst s1' is routed to detector 18b. If the signal photons are indistinguishable then the splitter 22 may be an optical power splitter. If the signal photons are distinguishable by some parameter (for example polarization or wavelength), then the splitter may be designed to utilise the distinguishable parameter, for example be a polarization splitter or a wavelength filter. However, for purposes of this discussion, the photons are indistinguishable at the point at which they are incident upon the splitter 22.

In some circumstances the signal photons s1, s1' may be output into the same detector, for example detector 18a. However, there may be a probability that the signal photons s1, s1' are output into separate detectors as described above. When the apparatus 2 is used in applications where many photon bins are utilised, for example tens, hundred, thousands or millions of time bins in boson sampling applications, there will statistically be a portion of the time bins where the signal photons are incident upon different detectors. For that portion of time bins the apparatus 2 can resolve between a bin with a single signal photon and a bin with a double signal photon. Furthermore, by having multiple detectors that the photons of any time bin can be detected by, allows a portion of the time bins to be detected at a faster rate, with a decreased effective detector dead time for the detector set. For example, if just one detector was used, the time delay between each successive time bin would ideally be greater than or equal to the detector dead time so that the detector could refresh and be ready to detect another photon. By having multiple detectors, there will be a statistical amount of time bins where one photon would go to the top detector 18a whilst the photon in the next subsequent time bin goes to the other detector (bottom) 18b. This results in an aggregate detector speed increase for the detector set when considering multiple photon bins.

A similar arrangement for the second detector set 14b is shown at the bottom of FIG. 5A for incoming idler photons i1 and i1' where a splitter 22 is used to input light from an input optical channel into two detectors 20a, 20b. In any of the detector examples provided herein a splitter may not be required and a pixel-like detector may be used whereby detector itself comprises multiple detector elements, each detector element configured to detect a different photon.

FIG. 5B shows an alternative detector arrangement for the detector set 14a, but using a plurality of splitters 22 optically connected to four detectors 18a-18d. In a similar manner to the detector set 14a shown in FIG. 5A, the splitters 22 may form part of the detector set 14a, as exemplified in FIG. 5B, or may be separate to the detector set and optical coupled to the detectors 18a-18d. In the configuration shown in FIG. 5B, the signal photons s1, s1' are input along a common input channel of a first splitter 22. The first splitter has two outputs, or 'output arms'. Each output of the first splitter 22 serves as an input to a further splitter 22 on each output arm. Each of the two further splitters 22 have two output arms that can output light into, respectively, one detector of the four detectors 18a-18d. The detector arrangement in FIG. 5B provides further increases in aggregate speed of the apparatus 2 and allows further resolution of number of photons in the same time bin. For example, if two signal photons s1, s1' enter the first splitter and both get output along the topmost arm, then unlike the detector set 14a of FIG. 5A, there is then a further chance that the signal photons s1, s1' are split again so that s1 and s1' go into different detectors, e.g., one of s1 and s1' goes into detector 18a whilst the other signal photon of s1 and s1' goes into detector 18b. The more splitters 22 and detectors 18a the detector set 14a has increases the ability of the system to resolve multiple photons in the same time bin. Furthermore, increased numbers of detectors 18a may also increase the aggregate detection speed of the apparatus 2 for similar reasons as discussed above. The detector arrangement, including its splitters 22 and detectors 18a-d, in FIG. 5B may also be used for the detector set 14b for the idler photons i1, i1'.

A detector arrangement such as that of FIG. 5B can be used to perform photon number resolving measurements, which is particularly useful in some applications such as boson sampling.

Any of the splitters 22 described above may have two or more output channels and may have any splitting ratio, for example a splitter 22 may have three output arms and split light power equally between those arms or unequally. The splitters 22 may be arranged in a concatenated manner as shown in FIG. 5B or in other splitter connection configurations. Any of the above splitter/detector arrangements described above may be used with any of the examples herein.

In examples, the first splitter comprises a polarizing beam splitter, thereby enabling the detectors to measure photons in different polarization states. In further examples, a polarization rotator, for example a Pockel cell, is placed in front of the polarizing beam splitter, thereby enabling the measurement of photon polarization states in different polarization bases.

The skilled person will appreciate that other detector types may be used with the apparatuses described herein. One example is a nanowire detector that generates an output signal intensity proportional to the (discrete) number of photons that strike that detector, and so is particularly useful in photon number resolving measurements.

FIG. 6 shows the example apparatus 2 of FIG. 1C further comprising an optical source system 24, also referred to as a 'source system' or 'pulse source system' herein. The source system 24 in FIG. 6 comprises the non-linear optical element 4 and further components including at least an optical source 26 configured to receive one or more electrical signals and output light P1. In other examples described herein, the pulse source system does not include the non-linear optical element 4. Examples of the optical source 26 include but are not limited to a laser, such as a distributed feedback (DFB) laser. The optical source 26 may output light that is pulsed or continuous wave (CW). The wavelength of operation of the optical source may be any wavelength, for example between 700-1700 nm, or more of the following bands: the O-band (original band: 1260-1360 nm); the C-band (conventional band: 1530-1565 nm), the L-band (long-wavelength band: 1565-1625 nm); the S-band (short-wavelength band: 1460-1530 nm); the E-band (extended-wavelength band: 1360-1460 nm). The wavelength of operation of the optical source may be a telecommunications wavelength, for example between 1300 nm and 1600 nm. The optical source may be wavelength tuneable.

The output light P1 is input into an optical modulator 28 which outputs light pulses P2. The light pulses may be gated by the optical modulator 28 to have any desired repetition frequency, for example (e.g., minimum=100 kHz, maximum=1 GHz with an operation range continuously tunable inbetween). In some examples the optical modulator may not be required and the desired pulses may be output directly from the optical source 26 which may be directly modulated or comprise an integrated optical modulator. The optical modulator may be an absorption-based modulator or an interferometric-based modulator such as a Mach-Zehnder modulator.

The output of the optical modulator P2 is input into a series of one or more further non-linear optical elements 30, for example optical elements set up to use second harmonic generation (SHG) to convert input light P2 into frequency doubled output light P3. FIG. 6 shows a single further non-linear photonic element, however the source system 24 may comprise a series of two or more further non-linear photonic elements 30, each outputting its light into the next element, for example a series of two SHG based optical elements each frequency doubling its input light. The optical output P3 of the chain or one or more further non-linear photonic elements 30 is input into the non-linear photonic element 4 as pump light. Examples of types of further non-linear optical elements 30 include but are not limited to bulk or waveguided SHG stages comprised of non-linear optical materials such as ppLN, ppKTP, either in a single pass or a multi-pass cavity configuration.

The non-linear photonic element 4 may use spontaneous four wave mixing (SFWM) or spontaneous parametric down conversion (SPDC) to convert pump light P3 into signal/idler photon pairs 6a,6b. For SPDC the resulting photon pairs 6a/6b have lower frequencies and longer wavelength than the pump light P3. Using frequency doubling elements 30 in the optical source system 24 enables the use of standard lasers such as standard telecommunication lasers to be the initial optical source 26 for the apparatus 2 if the wavelength of the signal idler photons is to be less than or equal to the wavelength of the optical source 26. The non-linear photonic element may be placed inside a photonic cavity, for example between mirrors or other optical reflecting elements. The non-linear photonic element may comprise a non-linear crystal waveguide with end facets covered with a reflective coating. Thus, an example non-linear optical element for generating photon pairs may be a cavity parametric down conversion (CPDC) device.

The components of the optical source system 24 may be formed separately and optically linked to each other or any one or more of them may be integrated together. The optical links between any two of the components of the optical source system may be any of: free space, optical fibre, integrated waveguides. The optical source system 24 may have other components such as but not limited to, optical amplifiers or optical attenuators to control the light amplitude of any of light signals P1-P3 and optical polarization controllers to control the polarization of any of light signals P1-P3.

The optical source 26 and/or the optical modulator 28 may in some examples receive electronic signals derived from detection signals from the plurality of detectors of the apparatus 2. This enables the detection of the signal and or idler photons 6a, 6b in the apparatus 2 to feedback into the driving of the optical source system 24. An electronic controller or other computing system may receive the electrical signals from the detectors 14, process the electrical signals accordingly, and then output the electrical signal to the optical source system 24. The controller may take the form of an FPGA, or a bulk controller such as that of FIG. 12. This feedback may be advantageous for a number of reasons which are discussed underneath.

Firstly, the detection signals generated by the detectors detecting the idler photons 6b may be used to determine whether or not time bins are being populated with enough, too few or to too many photon pairs 6. If photon pairs 6 are being over generated in time bins, then the feedback signal to the optical source system 24 may be used to decrease the output power of the optical source 26 or control the peak output power of any other component in the optical source system 24 such as the modulator 28 and/or any other components such as optical amplifiers (not shown). Conversely if there are statistically too few photon pairs being generated in time bins output by the non-linear photonic element 4, then the feedback signal provided to the optical source system 24 may be used to increase the power of the optical signal P3 entering the non-linear photonic element 4. This may be done by increasing the output power of the optical source 26 and/or any other component of the optical source system 24, for example requiring the optical modulator 28 to increase the peak pulse power being output in output light P2.

Secondly the detectors in detector set 14a may detect a succession of signal photons 6 that have been coupled into the loop path 8 and subsequently coupled out of the loop 8. This enables the apparatus 2 to determine the time it takes the signal photons 6a to traverse the loop path 8. This timing information may be used to generate feedback signals to the optical source system 24 to change the output pulse repetition rate from either the optical source 26 and/or the optical modulator 28. The change or tuning of the output pulse repetition rate, that results in the repetition rate of pump light P3, may be made to match or substantially match the transit time of the signal pulses around the loop path 8. A benefit of this set-up is that once a loop path 8 has been formed, the optical source (e.g., output repetition rate of the signal photons) may be tuned to match the path 8 instead of the other way around. Changing the loop path 8 to match the pulse rate of the optical source system 24 may be more difficult. Furthermore, the tuning of the pulse repetition rate to the loop path length may be done quickly and during the operation of the apparatus 2.

The apparatus 2, including any of the components and systems described above may be formed by using separate components and optically linking them using any of free space and bulk optics components, optical fibres and integrated optics. Additionally, or alternatively any two or more components may be integrated together using monolithic or hybrid integration.

FIG. 7A shows another example of the apparatus 2. The apparatus 2 in this example includes a pulse source system 700 that may be similar to other photonic pulse generating systems as described elsewhere herein. The pulse system 700 in this example, as depicted in FIG. 7B, comprises a continuous wave (CW) laser 711. This laser 711 may be a laser typically used in the telecommunications industry and having an output wavelength centred at 1552 nm. The optical output of the laser 711 is input into an optical fibre which enables the transmission of light output from the laser 711 to an optical amplifier and pulse carver system 712. The optical amplifier and pulse carver system 712 amplifies the light that is input from the continuous-wave laser 711. It also forms classical photonic pulses out of the CW laser light. These pulses are output from the amplifying and pulse carving system 712 in a periodic train at a rate of 20 MHz, although any output repetition rate can be used. The pulses output from the pulse carver 712 are then input into a further optical fibre that enables the pulses to be transmitted into a first second-harmonic-generation (SHG) unit 713 used to convert the input pulses into frequency-doubled output pulses having a wavelength of 776 nm and a bandwidth of 1 GHz. Examples of materials that may be used as the non-linear optical medium in this SHG unit 713 include any of, but not limited to: $LiIO_3$., $\beta$-$BaB_2O_4$, KTP ($KTiOPO_4$), KTA, periodically-poled crystals, such as PPLN (Periodically Poled Lithium Niobate).

The frequency converted output of the frequency doubled pulses from the first second harmonic generation unit 713 is input into a further optical fibre that enables the transmission of these frequency doubled light pulses into a further (second) SHG unit 714. Any unconverted light at 1552 nm may be filtered out by an optical filter (not shown) prior to entering the further second harmonic generation unit 714. The output of the second second-harmonic-generation unit 714 is a further frequency doubling of the input light it has received, to 388 nm wavelength pulses. Again, any unconverted 776 nm light output from the second harmonic generation unit 714 may be optically filtered out of the light used to input into the next component of the apparatus 2. Examples of materials that may be used as the non-linear optical medium in this SHG unit include any of, but not limited to: $LiIO_3$., $BiB_3O_6$.

Thus, if the input light into the first SHG unit 713 is of a telecommunications wavelength, then the output of the first SHG unit 713 is light in the near infrared spectrum. The output of light from the second SHG unit 714 is light in the blue spectrum. The converted light output from the second SHG unit 714 is the output of the pulse source system 700.

The light pulses output from the pulse source system 700 are classical light pulses 701 propagating along an optical fibre towards a non-linear photonic element (numeral 4 in FIG. 1C), which in this example is a cavity parametric down conversion source 702. Unlike in other example discussed herein, the non-linear photonic element 702 that generates the photon pairs is not part of the pulse source system 700, but may be part of it in other implementations.

The cavity parametric down conversion source (CPDC) is a parametric down conversion source located within an optical cavity. The optical cavity is formed from two or more optical reflectors. These optical reflectors may be mirrors, for example bulk optic mirrors or highly reflective coatings on the end of ends of components such as waveguides. The optical reflectors may also be other reflective elements such as Bragg gratings.

The output of the CPDC 702 comprises three different optical outputs, assuming a single signal-idler photon pair is produced. The first optical output is a signal photon 703a (numeral 6a in FIG. 1C) that has been generated as a result of the parametric down conversion process. A second optical output from the CPDC 702 is a single idler photon 703b (numeral 6b in FIG. 1C). The signal photon 703a and the idler photon 703b are complementary photons of the same photon pair generated in the parametric down conversion non-linear optical process in the CPDC source 702. A third optical output from the CPDC source 702 is the remaining unconverted photons of the classical light pulse 701 that has propagated through the CPDC source 702 and has not been converted. The CPDC source 702 outputs photons with a narrow spectral bandwidth and lineshape as defined by the cavity modes for the signal and idler, on the order of 1 GHz. The corresponding temporal duration of the photons is on the order of 100 ps-10 ns depending on the exact spectral bandwidth. The long temporal duration of the photons relaxes the constraints on temporal mode matching between the loop and laser train period. The CPDC source 702 also has an increased brightness within the bandwidth of the output modes due to the resonant enhancement of the non-linear process within the cavity. In the case of a triply resonant cavity for pump, signal and idler, this enhancement is approximately proportional to the product of the cavity finesse for each field. Advantageously, this means that time bins/time slots are populated with a single photon with a higher probability, increasing the number of occupied time bins that may be run through the system. This is particularly advantageous in applications using (e.g., requiring) many single photons, such as boson sampling.

The idler photon 703*b* is output along a different optical path to the signal photon 703*a*. In FIG. 7A, the signal photon 703*a* and the idler photon 703*b* are output onto different optical fibres. The optical fibre carrying the idler photon 703*b* is connected to a detection array, which in this example is a single photon detector array 707 (e.g. an array of single photon detectors). Correspondingly, the optical fibre carrying the signal photon 703*a* is optically connected to a photonic element which in this example comprises a photonic switch 704. This photonic switch 704 is a controllable switch that enables controllable variation of the optical path that input light is output upon. In this example the switch 704 comprises two input ports and two output ports. The signal photon output from the CPDC source 702 is input into a first input port of the switch 704. Examples of this switch include an optical fibre switch in a Mach-Zehnder configuration, a MEMS-based switch, a null-coupler based switch, or an acousto-optic modulator-based switch.

The switch 704 may in some examples be composed of a polarizing beam-splitter, or for example a Pockel's cell or another form of electro-optic polarization rotator. One polarization output of the polarizing beam splitter may be coupled into the looped path while the other is directed towards the single photon detection array 707.

As described in previous examples above, the switch 704 may be used to couple the incoming signal photon 703*a* from the CPDC into a fibre loop 705 (numeral 8 of FIG. 1C). The optical fibre or series of optically connected optical fibres forming the fibre loop 705, is connected at one end to a first output port of the optical switch 704, from which it receives photons. The opposite end of the fibre loop 705 is optically connected to a second input port of the optical switch 704. The second output port of the switch 704 outputs light from either the first or second input ports towards a detector arrangement. In this example the detector arrangement is a single photon detector array 707 similar to the array 707 used to detect the idler photon 703*b*. Either of these detector arrangements may utilise a detection arrangement similar to that shown and described for FIGS. 5A and 5B. The single photon detector array may be for example an avalanche photodiode-based detector array or a super conducting nanowire detector array. Any of these detector types may be used in other examples herein. The switch may be operated, in a controllable manner, by the input of one or more electrical signals, such as an electrical control signal output from a computing device such as that of FIG. 12, or a Field Programmable Gate Array.

In this example, similar that of FIGS. 3A-3D, the fibre loop 705 has an optical path length similar to the time delay between successive signal pulses output from the non-linear element 702. In other words, the transit time for a first signal photon to pass through the switch 704 and exit the switch and travel round the loop 705 to the point of re-entry into the switch 704 via the other input port, is the same as or substantially similar to the time interval between successive signal photons entering the switch from the CPDC source 702. The first signal photon is therefore coincident, in time, with a next signal photon entering the switch, albeit the first signal photon is entering the switch 704 from a differ input port to the second signal photon.

By operating the switch 704 to either continually store the photon in the loop or output photons from the loop, the signal photon 703A may therefore be controllably output into different time bins for example time bin 1 (706*b*) or time bin 2 (706A). The apparatus in the example may be used in a similar manner to that described for FIG. 3A-3D or 4A-4F.

In the above example optical fibres are used to connect the components. This may be a single mode optical fibre, or it can be a different type of optical fibre, for example a polarization-maintaining fibre. The optical fibre may be a unitary element or it may be a span of multiple optical fibres optically linked and mechanically connected together. The loop might also include a polarization rotator or wavelength converter to controllably switch photons out of the loop. Any of the features described in this example may be used in other examples described hearing, furthermore any of the features described in other examples may be used in this example.

Figure 8:
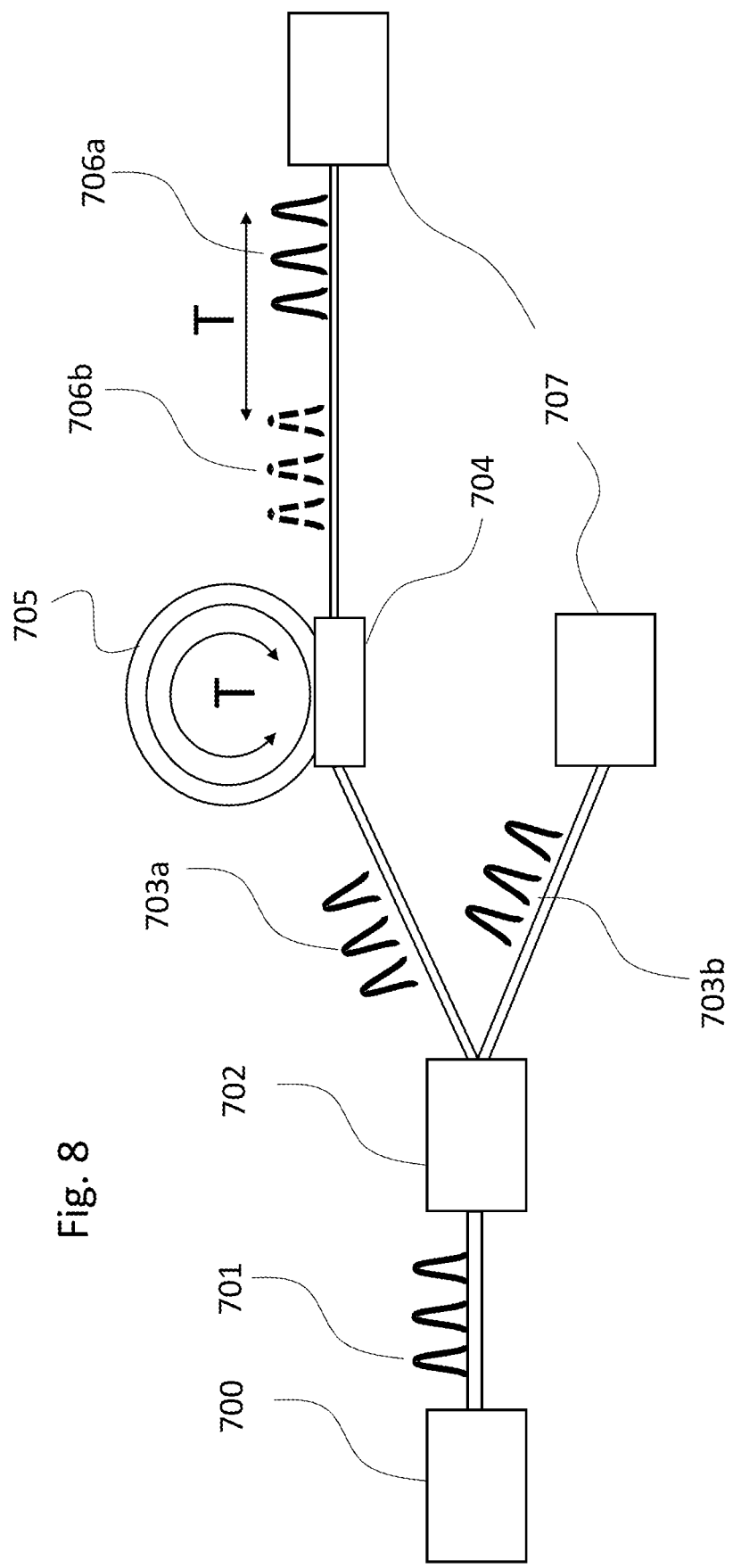
FIG. 8 shows an example of an apparatus similar to that of FIG. 7A, in which the looped path has a round trip time that is a multiple of the time between generation of consecutive signal and idler photon pairs.

FIG. 8 depicts a further example of an apparatus 2 that is similar to the apparatus shown and described with respect to FIG. 7A, wherein like references numerals refer to like components.

In FIG. 7A the fibre loop 705 had a length corresponding to the time delay between successive signal pulses output from the non-linear element, which in FIG. 7A was a CPDC source 702. In FIG. 8, however, the pulsed source system 700 outputs multiple classical light pulses in successive groups of two or more light pulses. A time period of substantially no output light pulses exists between each group. The output of light pulses from the source system 700 may have many groups/trains of pulses, including at least a first group of pulses and a second group of pulses wherein the second group of pulses is output from the source 700 after the output of the first group of pulses. FIG. 8 shows a time spacing between the first and second trains of pulses, but the skilled person will appreciate that this is not required.

Correspondingly when each group of pulses propagates through the non-linear optical element (which in this example is also a cavity parametric down conversion source 702), groups/trains of signal photons 703*a* and groups/trains of idler photons 703*b* are also output along different optical fibres in a similar manner to that described for FIG. 7A.

The signal photons 703*a* propagate along an optical fibre and are input into the switch 704. As with FIG. 7A, the loop of fibre 705 is connected from one of the switch outputs to one of the switch inputs. The round-trip time of the loop 705 in FIG. 8 is greater than or equal to the time period between the first signal photon in the first group and the first signal photon in the second group. Thus, the switch 704 can operate to controllably switch any or all of the signal photons from the second group into the loop, or not, after all the signal photons of the first group have been coupled out of the loop 705 towards the detectors 707. Alternatively the switch 704 can operate to controllably interfere the first train of signal photons with the second train of signal photons.

The example in FIG. 8 therefore enables the apparatus to operate on bunches of signal photons in each time period.

Because bunches of photons are coupled in or out of the loop, each signal photon of the same bunch is coupled into or out of the loop by the same extent as any of the other signal photons in the same bunch. For example, if the first bunch (or group) of signal photons comprised 100 signal photons then each of those signal photons is coupled into the loop with the same probability. Similarly for the second group of photons, for example another 100 signal photons, each of these signal photons in the second group couples into the loop 705 by the switch 704 with the same probability. The first group of photons and second group of photons may be operated on differently by the switch 704. For example, the first group of photons maybe coupled into the loop 705 with a probability of 50%, whilst the second group of signal photons maybe coupled into the loop 705 with a probability of 25%.

The switch 704 in this example therefore may operate at a reduced speed (e.g., operating frequency) than in other examples where each consecutive photon in the whole photon train may be operated on individually to control the probability of each photon being coupled into or out of the loop 705. In many photonic platforms, the operating time of a photonic switch can act as a bottleneck to performance and so the ability to operate the switch 704 at a reduced speed while keeping the same photon detection rate is advantageous.

Figure 9:
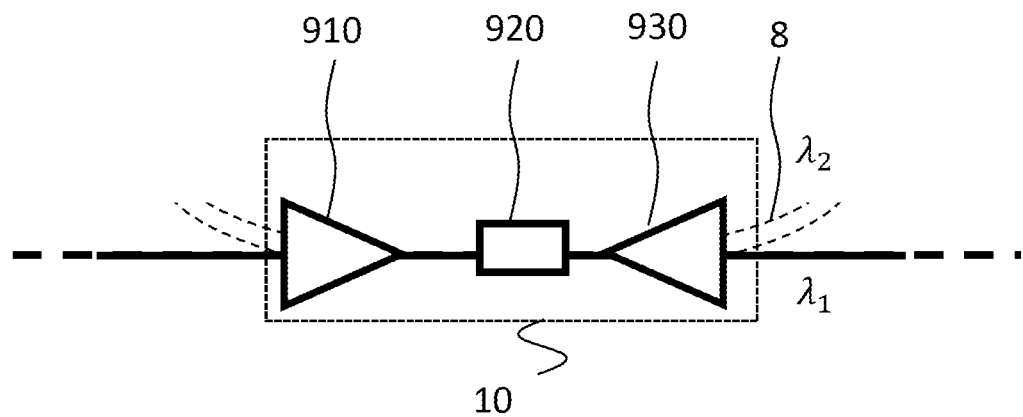
FIG. 9 shows an alternative module for use in an apparatus such as shown in FIG. 1C.

FIG. 9 shows an example of a module for use in an apparatus such as that discussed above in relation to FIG. 1C. The apparatus comprises a looped path 8 and a photonic element 10 that function as described above in relation to FIG. 1C. The module of FIG. 9 may use components or optional configurations of other examples described herein, including but not limited to: features or detectors or detection arrangement as shown in FIGS. 5A and 5B; pulsed source systems (such as that shown in FIGS. 6 and 7B) to input light into the non-linear element that creates photon pairs; any optical connecting elements such as waveguides, optical fibres discussed in any example herein, for example the apparatus may use integrated waveguides or free space and bulk optic components to form the looped path; any types of photonic detector described for any of the other examples; the looped path length, for example the absolute optical path length and/or its relative length to the rate of signal photons produced by the non-linear photonic medium; the type of non-linear medium used to create the signal/idler photon pair; any details of other components such as optical fibre types, filter types and polarization dependent component types.

The photonic element comprises a first wavelength-division multiplexer (WDM) 910, a second WDM 930, and a wavelength converter therebetween. The second WDM 930 is configured to couple light into a first end of the looped path 8 or into an optical path towards the detector arrangement depending on the wavelength of the light. The first WDM 910 is configured to receive light either from the non-linear photonic element 4 or from the second end of the looped path 8, and to pass that light towards the wavelength converter 920 and second WDM 930.

According to one example, a photon may be received from the non-linear photonic element 4 having a first wavelength $\lambda_1$ and pass through the first WDM 910. The wavelength converter 920 may, based at least in part on a control signal (not shown), convert the first wavelength $\lambda_1$ to a second wavelength $\lambda_2$. The second WDM 930 may couple the photon into an optical path towards the detectors 14 if the photon has the first wavelength $\lambda_1$ and may couple the photon into the looped path 8 if the photon has the second wavelength $\lambda_2$. In this way, a photon may be controllably stored and released in the apparatus according to the operation of the wavelength converter 920. In particular, the photon is not stored unless the wavelength converter 920 is operated to store the photon in the loop.

According to another example, a photon may be received from the non-linear photonic element 4 having the second wavelength $\lambda_2$ and pass through the first WDM 910. The wavelength converter 920 may, based at least in part on a control signal (not shown), convert the second wavelength $\lambda_2$ to the first wavelength $\lambda_1$. The second WDM 930 may couple the photon into an optical path towards the detectors 14 if the photon has the first wavelength $\lambda_1$ and may couple the photon into the looped path 8 if the photon has the second wavelength $\lambda_2$. In this way, the default setting is that a photon is stored in the looped path 8, and the photon is released if the wavelength converter 920 is operated.

The wavelength converter 920 and the control signal applied thereto may take any suitable form. In one example, the wavelength converter 920 comprises a non-linear optical medium (such as $LiIO_3$., $\beta$-$BaB_2O_4$, KTP ($KTiOPO_4$), KTA, or a periodically-poled crystal such as PPLN (Periodically Poled Lithium Niobate)) used to convert input pulses having a third wavelength $\lambda_3$ into frequency-doubled output pulses that have wavelength $\lambda_1$. The control signal may be an optical control pulse timed so as to coincide with the received photon at the wavelength converter 920, and having a fourth wavelength $\lambda_4$ such that the superposition of the optical control pulse and the received photon has the appropriate third wavelength $\lambda_3$ to trigger the down-conversion. In another example, the wavelength converter 920 may comprise an electro-optical wavelength converter configured to convert the wavelength of received light in response to an electrical control signal.

Figure 10:
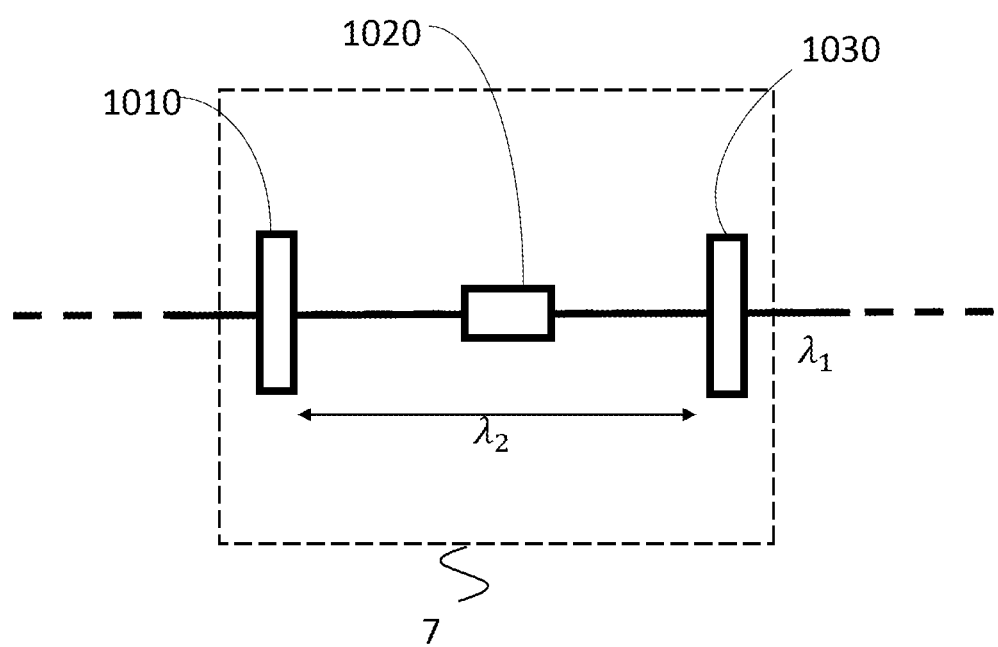
FIG. 10 shows a module for use in an apparatus such as shown in FIG. 1A.

FIG. 10 shows an example of a module 7 of an apparatus 2 (FIG. 1A) that does not include a looped path 8. The module 7 of FIG. 10 comprises a first fiber Bragg grating (FBG) 1010, a second FBG 1030, and a wavelength converter 1020 therebetween. The first and second FBGs 1010, 1030 are configured to transmit light having a first wavelength $\lambda_1$ and to reflect light having wavelength $\lambda_2$. The module 7 of FIG. 10 may receive a photon having the first wavelength, and may convert the first wavelength to a second wavelength based on a received control signal. Light having the second wavelength may accordingly be stored between the FBGs while light having the first wavelength may pass through the FBGs. The wavelength converter 1020 may be any suitable wavelength converter such as those described above in relation to FIG. 9.

Figure 11A:
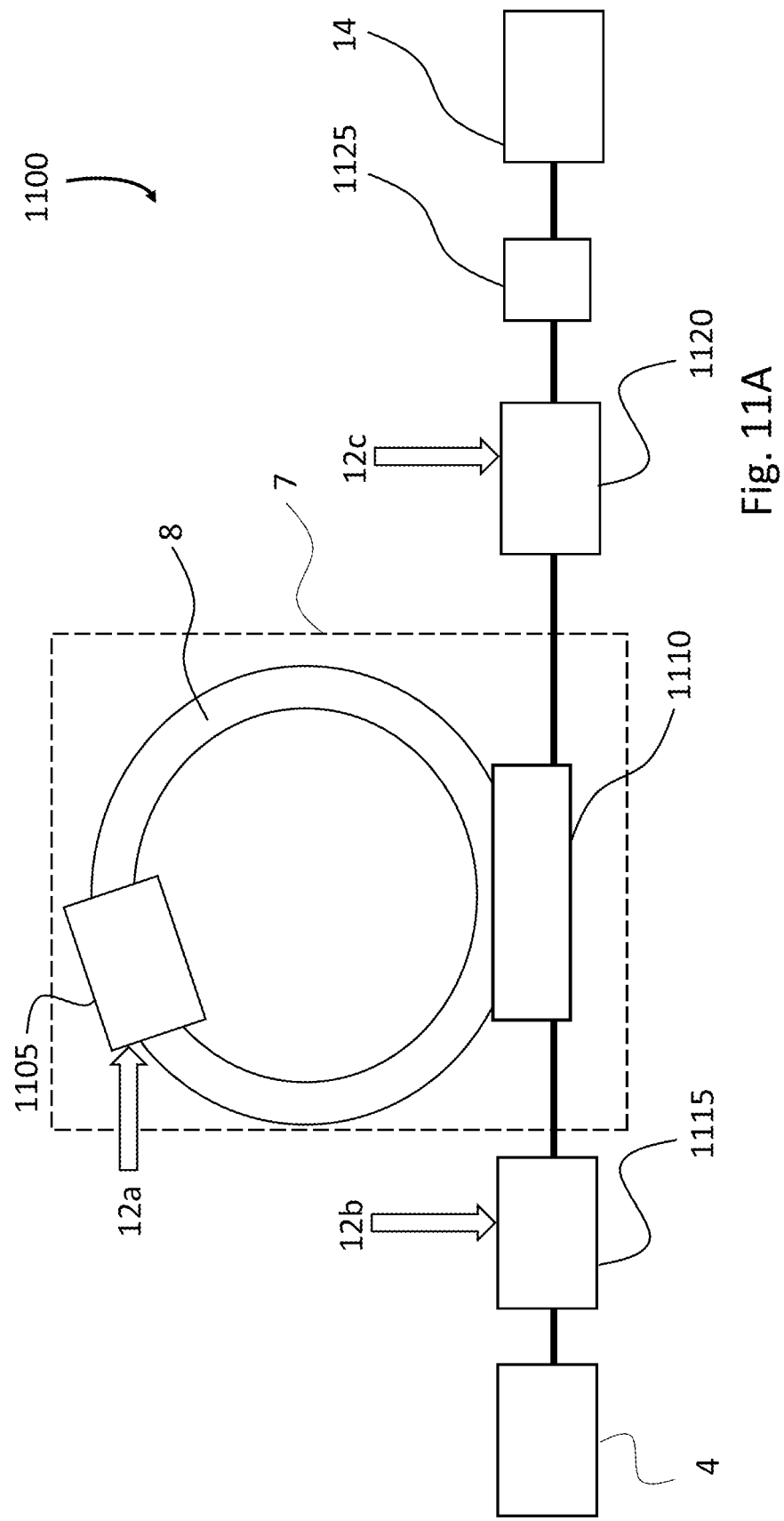
FIG. 11A shows an example of an apparatus for interfering successive signal photons.

FIG. 11A shows another example of an apparatus 2 that includes a looped path 8. As with FIG. 1A, the apparatus 2 of FIG. 11A comprises a non-linear photonic element 4 for outputting a signal and idler photon pair. The non-linear photonic element 4 may be similar to that of other non-linear photonic elements discussed in other examples, for example a cavity PDC source. The apparatus 2 of FIG. 11A further comprises a module configured to, based on receiving one or more control signals, controllably store photons and controllably output stored photons. The apparatus 2 of FIG. 11A further comprises a detector arrangement 14 comprising one or more photonic detectors for detecting light. This detector arrangement may be an arrangement as described in any of the examples herein. The idler photon is detected by a photonic detector in a separate detection event to detecting the signal photon. The detection of the idler photon may be via a different detector or by having the idler photon arrive at a different time at the same detector. Detection of the idler photon heralds the knowledge of a signal photon being generated. The photonic paths linking different components may be any type of photonic path, including free space and integrated waveguides, however they are preferably optical fibre.

Like the apparatus of FIG. 1C, the module 7 comprises a looped path 8 for guiding photons and a photonic element. The module 7 of FIG. 11A is configured to receive at least one of the signal or idler photons output from the non-linear element 4, to at least partially couple one of the signal or idler photons into the looped path 8, and to at least partially couple the said signal or idler photon out of the looped path 8 along an optical path towards the detector arrangement 14.

The photonic element comprises a polarizing photonic element 1110. Unlike the apparatus of FIG. 1C, the photonic element 1110 may be a static component that is not controlled using control signals, for example a polarizing beam splitter (PBS).

Unlike the apparatus of FIG. 1C, the looped path 8 of FIG. 11A comprises a first polarization rotator 1105 for controllably rotating a polarization of light into a superposition of a first polarization state having a first polarization and a second polarization state having a second polarization. The first and second polarizations may be any polarizations, but are preferably orthogonal to each other. For example, the first polarization may be a horizontal polarization whilst the second polarization may be a vertical polarization. The polarization rotator 1105 is configured to rotate a polarization of light based on one or more control signals 12a.

The polarizing photonic element 1110 is arranged to receive light from the non-linear photonic element and to output light having the first polarization into a first end of the looped path 8 and to output light having the second polarization into the optical path towards the detector array 14. The polarizing photonic element 1110 is further arranged to receive light from the second end of the looped path 8 and to output light having the first polarization into the first end of the looped path 8 and to output light having the second polarization into the optical path towards the detector array 14. Accordingly, in use the photonic element 1110 may receive photons and guide the photon into the looped path 8 or towards the detector arrangement 14 based on a polarization of the photon. For example, if a photon is received by the photonic element 1110 in a first polarization state having the first polarization, then the photon is guided into the looped path 8. For example, if a photon is received by the photonic element 1110 in a second polarization state having the second polarization, then the photon is guided towards the detector arrangement 14. If the photon is in a quantum superposition of the first polarization state and the second polarization state, then the photon is placed into a superposition of stored (in that the first quantum state is couple into the looped path 8) and not stored (in that the second quantum state is not coupled into the looped path 8). The first polarization rotator 1105 is controllable to rotate the polarization of any light in the looped path 1105 in order for the photonic element 1110 to either maintain that light in the loop or couple that light out of the loop.

The apparatus 2 of FIG. 11A further comprises an optional second polarization rotator 1115, an optional third polarization rotator 1120, and an optional polarization splitter 1125.

The second polarization rotator 1115 is for controllably rotating a polarization of a signal or idler photon received from the non-linear photonic element 4 into a superposition of a first polarization state having the first polarization and a second polarization state having the second polarization, and for outputting the rotated photon to the photonic element 1110. While the second polarization rotator 1115 is shown separate from the module 7 in FIG. 11A, the second polarization rotator may be comprised within the module 7. Advantageously, the second polarization rotator 1115 located prior to the photonic element 1110 enables the tuning of the input signal (or idler) photon polarization prior to it entering the photonic element 1110. The second polarization rotator 1115 is adjustable (for example manually or via a control signal 12b) such that different degrees of polarization rotation may be selected. The polarization switch speed of the second polarization rotator 1115 may be slower than that of the first (1105) and third (1120) polarization rotators. The photonic element 1110 may be a passive polarization splitter/combiner, therefore the second polarization rotator 1115 may be used to align the polarization to a particular axis of the photonic element 1106, for example 45 degrees from both the first and second polarization axes such that the photonic element 1110 outputs the first and second quantum states with equal probability.

The (optional) third polarization rotator 1120 and (optional) polarization splitter/polarizing beam splitter 1125 are located in the optical path between the photonic element 1110 and the detector array 14. The third polarization rotator 1120 is arranged to receive light (having the second polarization) from the photonic element 1110 and output polarization-rotated light towards the detector arrangement 14, with the degree of polarization rotation determined based on one or more control signals 12c.

The third polarization rotator 1120 and polarization splitter 1125 may be useful in situations in which the detector arrangement 14 comprises a first detector arrangement 14a (comprising one or more photonic detectors) and a second detector arrangement 14b (comprising one or more photonic detectors), and first and second detector arrangements are arranged so as to detect differently polarized light. For example, the polarizing beam splitter 1125 may direct light having a third polarization (which may be the same as the first polarization or the second polarization) towards the first detector arrangement, and may direct light having a fourth polarization (which may be the same as the second polarization or the first polarization) towards the second detector arrangement. Accordingly, the third polarization rotator 1120 may be controlled so as to alternate between rotation angles such that light passing through the polarization rotator 1120 in one time bin has the third polarization and light passing through the polarization rotator 1120 in the next time bin has the fourth polarization. Advantageously, this arrangement can help to reduce the effective dead time of the detector arrangement 14 when, for example, a dead time of an individual detector is longer than one time bin's duration.

The first, second and third polarization rotators may be any suitable optical devices for controllably rotating the polarization axis of light. Such devices can be based, for example, on the Faraday effect, on birefringence, or on total internal reflection.

Figure 11B:
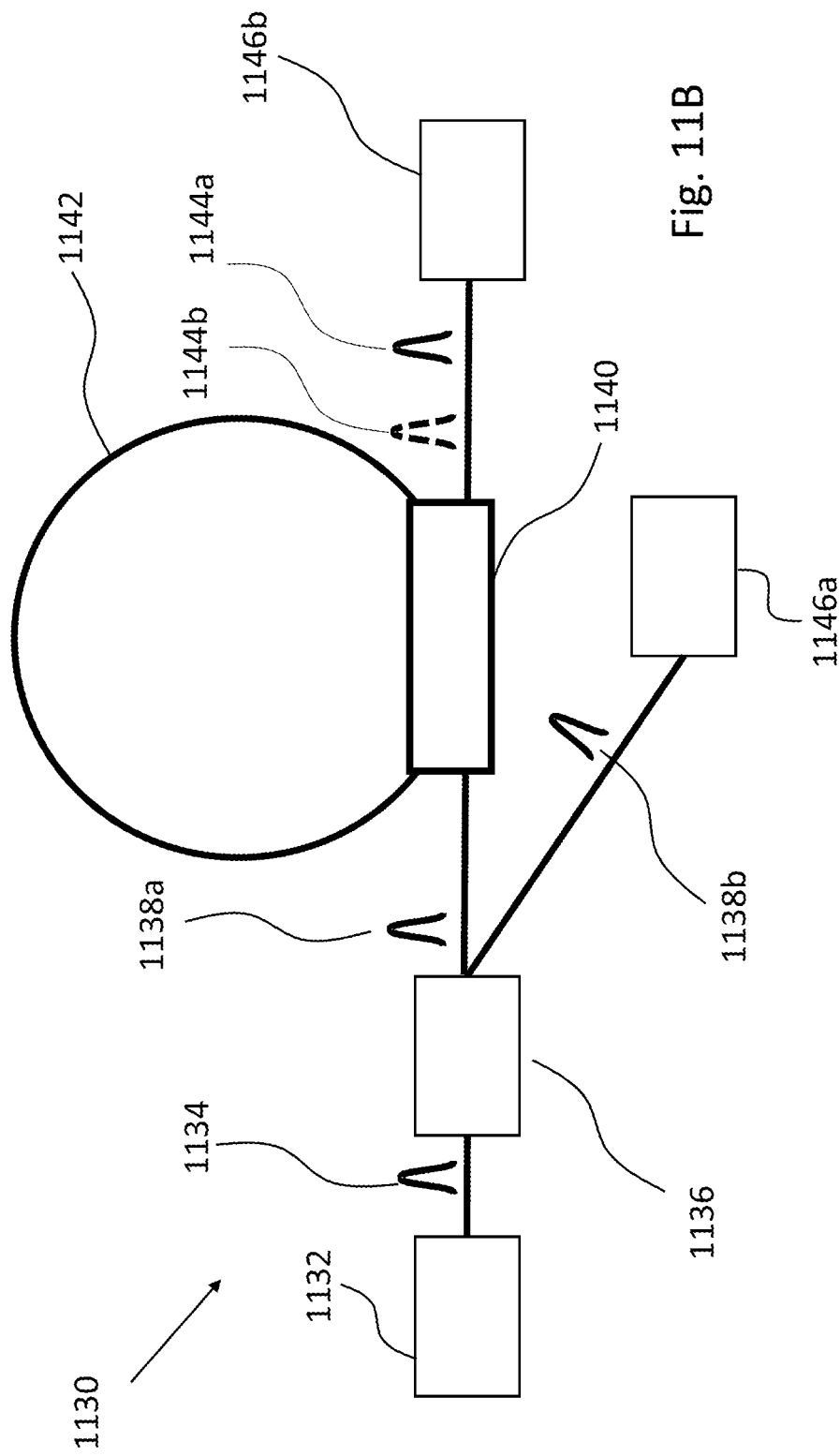
FIG. 11B shows a further example of an apparatus for interfering successive signal photons.
Figure 11C:
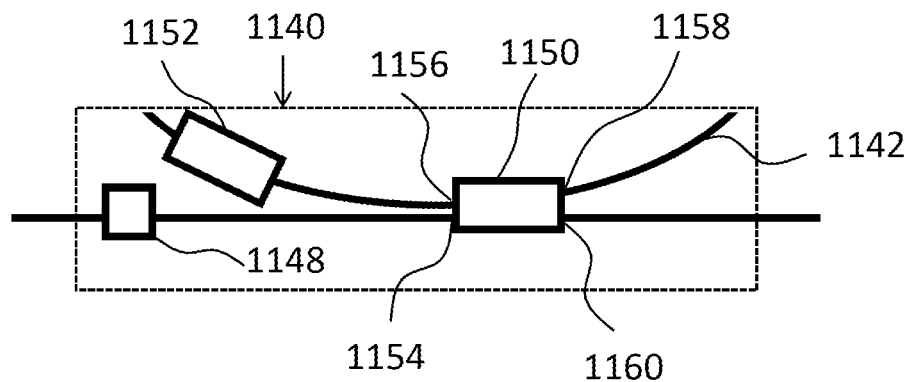
FIGS. 11C-11D shows expanded portions of elements of the apparatus in FIG. 11B.
Figure 11D:
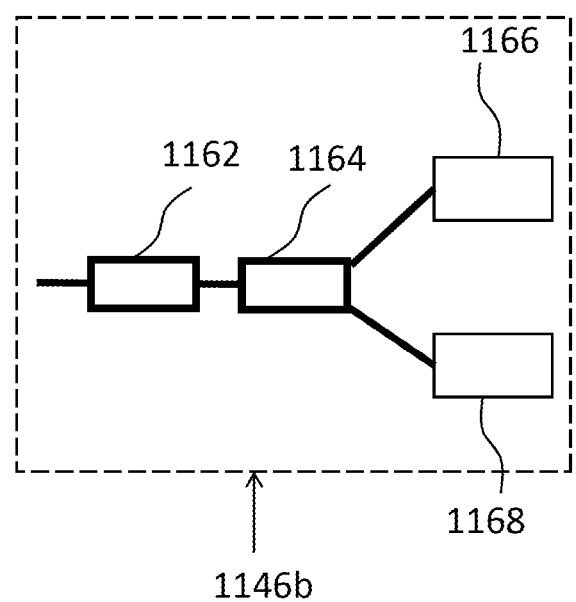

FIG. 11B-11D show an example implementation of the apparatus 1100 as an optical fibre-based apparatus 1130. A cavity PDC non-linear optical source outputs a signal/idler photon pair 1134 via an optical fibre to photonic splitter 1136 that routes the idler photon 1138b onto an optical fibre towards a single photon detector 1146a. The corresponding signal photon 1138a is routed along a different optical fibre to a quantum interference module comprising a system of components 1140 for interfering photons and a looped path 1142 formed from a span or one or more optical fibres, for example single mode optical fibres that may be polarization maintaining. The photonic splitter 1136 may be a polarization splitter or a wavelength-based splitter or any photonic splitter that utilises a property that the signal and idler photons have different values of. The cavity PDC 1132 in this example receives pump light optical pulses from a pulse source system (not shown) similar to that described for FIGS. 7A and 7B. This pump light is used by the cavity PDC to convert into signal and idler photon pairs. An optical filter (not shown) is used to filter out unwanted unconverted light from the pulse source system. The optical filtering of the pump light from the signal/idler pair may be facilitated by the photonic splitter, for example, the photonic splitter 1136 may be a wavelength based photonic splitter that does not direct pump light into the output optical fibres that carry the signal and idler photons.

FIG. 11C shows an expanded view of the system of components 1140 for interfering photons. A polarization controller 1148, such as an optical fibre-based polarization controller (manually or electrically adjustable) is configured to receive the signal photon 1138a via an optical fibre and output the signal photon via a further optical fibre to a fibre-based polarization beam splitter 1150. The polarization controller 1148 may be adjusted so that the signal photon is input into the polarization beam splitter 1150 with polarization components in each of the output polarization axes of the fibre polarization beam splitter 1150.

The fibre-based polarization beam splitter 1150 is a 2×2 polarization beam splitter in that it has two input ports, namely first input port 1154 and second input port 1156; and two output ports, namely a first output port 1160 and a second output port 1158. Each port is linked to a polarization maintaining (PM) optical fibre having a fast axis and a slow axis. The first input port 1154 has a first PM fibre that receives light from the polarization controller 1148 (also referred to as a 'polarization rotator'). The polarization rotator 1148 is set, for example by a control signal (not shown) or by manual adjustment, to provide input light polarized at 45 degree to each of the fast and slow axes of the fibre connected to the first input port 1154, thus the signal photon 1138a has polarization components in both the fast and slow axes of the first PM fibre.

Light launched along the slow axis of the first input port 1154 will be transmitted along the slow axis of the first output port 1160. Light launched along the fast axis of the first input port 1154 will be transmitted along the slow axis of the second output port 1158, thus along the slow axis of the PM fibre forming at least part of the looped path 1142. Light launched along the slow axis of the second input port 1156 will be transmitted along the fast axis of the first output port 1160. Light launched along the fast axis of the second input port 1156 will be transmitted along the fast axis of the second output port 1158.

Light entering the looped path 1142 via the second output port 1158 gets fed back into the second input port 1156 after passing through a polarization rotator 1152 such as Pockels cell. If the light entering the second output port 1158 keeps the same polarization (slow axis) as it propagates around the loop 1142, then it will exit the first output port 1160. If the Pockels cell 1110 changes the polarization of the signal photon traversing the loop by 90 degrees then the signal photon will couple back into the loop 1142. If the Pockels cell changes the polarization by 45 degrees then the signal photon will be aligned with a polarization between the fast and slow axes, akin to a diagonal polarization if the fast and slow axes are vertical and horizontal. Using the Pockels cell in this way allows the controllability of the signal photon quantum state in the loop to be any of: a) deterministically coupled out into the first output port 1160; b) deterministically coupled back into the loop 1142 via the second output port 1158; c) coupled out of the polarization splitter 1150 un-deterministically by having quantum states exiting in both the output ports 1158, 1160.

The input of a signal photon into the polarization beam splitter 1150 from the loop 1142, via the second input port 1156, may coincide, in time, with the input of a further signal photon from a further signal/idler photon pair. The quantum state of the signal photon 1138a that has traversed the loop 1142 may therefore interfere with the quantum state of the further signal photon entering the polarization beam splitter 1150. The further signal photon may have a polarization aligned to either deterministically enter either or the output ports 1158, 1160, or may have polarization components that get routed into both output ports 1158, 1160. The interfered quantum states resulting from interfering the first and second signal photon may propagate around the loop 1142 or out of the first output port 1160, along an optical path towards a detection arrangement 1146b. FIG. 11B shows an example of two such interfered quantum states 1144a/b exiting the first output port 1160 and propagating along an optical fibre towards the detection arrangement 1146b.

FIG. 11D shows an expanded view of the detection arrangement 1146. A second polarization rotator 1162, receives the signal photon quantum states or interfered quantum states output from the first output port 1160. This polarization rotator 1162 may be similar to the polarization rotator 1152 in the loop 1142 in that they both may selectively impart a different polarization rotation to different successive time-bins carrying the signal photon quantum states. In other words, the rate of generating a new polarization rotation by the polarization rotators 1152, 1162 may be greater than or equal to rate of new signal photons incident into the first input port 1154 (which is preferably periodic and equal to the transit time of the loop 1142). The second polarization rotator 1162 may be a Pockels cell.

The detection arrangement 1146b also includes a polarization splitter 1164 that receives the signal photon quantum states from the second polarization rotator 1162, via an optical fibre, and routes: a) one polarization via an optical fibre to a first signal photon detector 1166; and b) the orthogonal polarization to a second photon detector 1168. Rotating the polarization of the quantum states with the second polarization rotator 1162 enables the quantum states to be measured by the detectors 1166, 1168 in different bases. For example, without any polarization rotation by the second polarization rotator 1162, the splitter 1164 may direct all light along to the first detector 1166 because the polarizations making up the quantum state are all aligned along a single axis parallel to the axis of the splitter 1164 transmitting to first detector 1166. Whereas if the polarization rotator 1162 imparted a 45 degree polarization rotation then components of the quantum state will be directed towards both the detectors 1166, 1168. It is noted that features of other examples herein may be applied to this example, for example, but not limited to tuning the pulse source repetition rate to match the loop length.

The apparatuses 1100, 1130 may be used in generating an entangled photonic state. The entangled photonic state may comprise a cluster state.

The apparatus 1100 or apparatus 1130 may use components or optional configurations of other examples described herein, including but not limited to: features or detectors or detection arrangement as shown in FIGS. 5A and 5B; pulsed source systems (such as that shown in FIGS. 6 and 7B) to input light into the non-linear element that creates photon pairs; any optical connecting elements such as waveguides, optical fibres discussed in any previous example, for example the apparatus 1130 may use integrated waveguides or free space and bulk optic components to form looped path 1142; any types of photonic detector described for any of the other examples; the looped path length, for example the absolute optical path length and/or its relative length to the rate of signal photons produced by the non-linear photonic medium; the type of non-linear medium used to create the signal/idler photon pair; any details of other components such as optical fibre types, filter types and polarization dependent component types.

The apparatuses described above in relation to FIGS. 1A-11D are typically connectively coupled to a controller for generating the control signals 12 that drive particular parts of the apparatuses. The controller may take the form of a field-programmable gate array (FPGA) or an application specific integrated circuit (ASIC) or similar. For example, an FPGA may be used to controllably store a signal photon based on detection of a corresponding idler photon. One or more controllers may operate to selectively store one or more photons, and to selectively release photons, for example by changing the effective reflectivity of a reconfigurable beam splitter, or a polarization of a photon. The controller may further provide feedback to adapt a pulse rate of a laser source. While for the majority of applications, an FPGA or similar will be suitable as a controller, other options are also possible.

Figure 12:
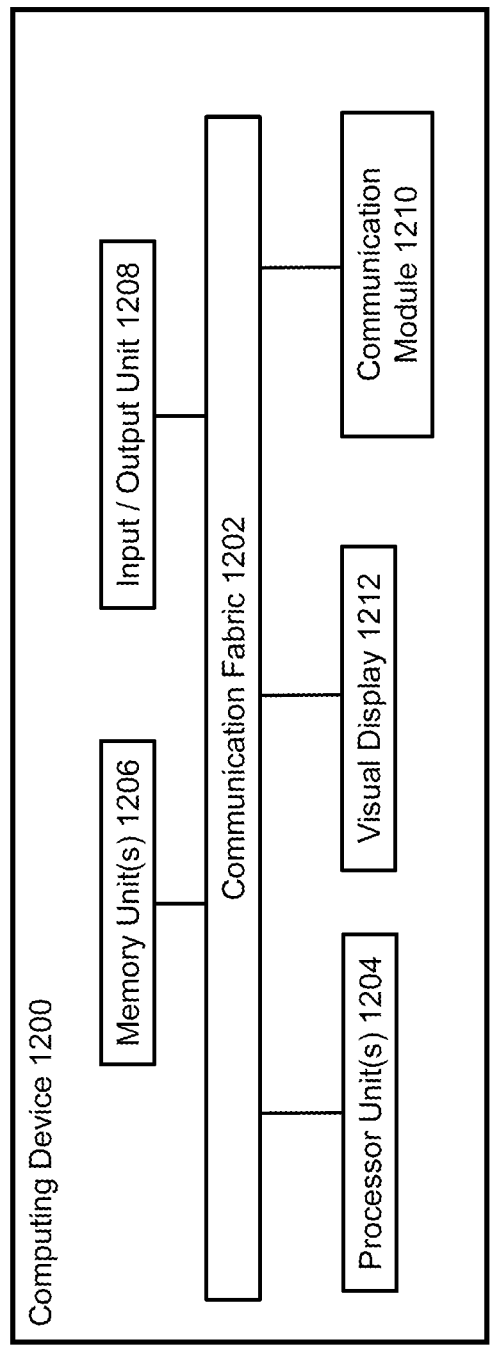
FIG. 12 shows a block diagram of an example of a controller.

FIG. 12 depicts a block diagram of a computing device 1200 that may act as a controller in some examples. Other architectures to that shown in FIG. 12 may be used as will be appreciated by the skilled person.

Computing device 1200 is an example of a computer, in which computer usable program code or instructions implementing the processes may be located. In this example, computing device 1200 includes communications fabric 1202, which provides communications between processor unit(s) 1204, memory unit(s) 1206, input/output unit 1208, communications module 1210, and display 1212.

The one or more processing units/processors 1204 are configured to execute instructions for software that may be loaded into the memory 1206. Processor unit(s) 1204 may be a set of one or more processors or may be a multi-processor core, depending on the particular implementation. Furthermore, processor unit(s) 1204 may be implemented using one or more heterogeneous processor systems in which a main processor is present with secondary processors on a single chip.

The one or more memory unit(s) 1206 may comprise any piece of hardware that is capable of storing information, such as, for example, data, program code in functional form, and/or other suitable information on a temporary basis and/or a permanent basis. The one or more memory units 1206 may include, for example, a random access memory or any other suitable volatile or non-volatile storage device. The one or more memory units may include a form of persistent storage, for example a hard drive, a flash memory, a rewritable optical disk, a rewritable magnetic tape, or some combination thereof. The media used for persistent storage may also be removable. For example, the one or more memory units 1206 may include a removable hard drive.

Input/Output unit 1208 enables the input and output of data with other devices that may be in communication with the computing device 1200. For example, input/output unit 1208 may provide a connection for user input through a keyboard, a mouse, and/or other suitable devices. The input/output unit 1208 may provide outputs to, for example, a printer.

Communications module 1210 enables communications with other data processing systems or devices. The communications module 1210 may provide communications through the use of either or both physical and wireless communications links.

Instructions for the applications and/or programs may be located in the one or more memory units 1206, which are in communication with processor unit 1204 through communications fabric 1202. Computer-implementable instructions may be in a functional form on persistent storage in the memory unit(s) 1206, and may be performed by processor unit 1204.

These instructions may sometimes be referred to as program code, computer usable program code, or computer-readable program code that may be read and executed by a processor in processor unit 1204. The program code in the different embodiments may be embodied on different physical or tangible (e.g., non-transitory) computer-readable media. For example, computer-readable instructions may be located in a functional form on a computer-readable storage medium that is selectively removable and may be loaded onto or transferred to computing device 1200 for execution by processor unit(s) 1204. A computer-readable storage medium may be, for example but not limited to, an electronic, magnetic, optical, electromagnetic, infrared, or semiconductor system, apparatus, device, or any suitable combination thereof. More specific examples of the computer-readable medium include the following: a portable computer diskette, a hard disk, a random access memory (RAM), a read-only memory (ROM), an erasable programmable read-only memory (EPROM or Flash memory), a portable compact disc read-only memory (CDROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

The skilled person would appreciate that the architecture described above in relation to FIG. 12 is not intended to provide limitations on the computing devices/controllers with which the methods described herein may be implemented. Instead, the skilled person would appreciate that other architectures may be applicable. For example, the computing device may include more or fewer components.

The following numbered Examples/clauses pertain to exemplary embodiments.

According to Example 1, an apparatus may comprise a non-linear photonic element for outputting a signal and idler photon pair. The apparatus may further comprise a module configured to, based on receiving one or more control signals, controllably store photons and controllably output stored photons. The apparatus may further comprise a detector arrangement comprising one or more detectors for detecting light. The module may be further configured to receive at least one of the signal and idler photons of the photon pair. The module may be further configured to at least partially store one of the signal or idler photons of the pair. The module may be further configured to output the said at least partially stored signal or idler photon along an optical path towards at least one of the detectors. The apparatus may be configured to direct the other of the signal or idler photon towards the detector arrangement.

Advantageously, the apparatus of Example 1 may enable a detector arrangement to detect an idler photon at a different time to detecting a signal photon. Furthermore, the ability to store a photon helps with many aspects of quantum computing.

According to Example 2, the apparatus of Example 1 may be further configured to use a signal output from at least one detector of the detector arrangement to control the rate of photon pair generation from the non-linear photonic element. Advantageously, an apparatus according to Example 2 may adjust the rate of photon pair generation automatically. For example, the signal of a detection of an idler photon in a first time bin can be used to cause a second signal/idler pair to be generated, which can be useful in applications in which a train of photons is desired (e.g., needed), each in successive time bins.

According to Example 3, the apparatus of Example 2 may further comprise a photon source configured to input pump photons into the non-linear photonic element. Controlling the rate of photon pair generation may comprise changing the rate of output pump light pulses from a photon source.

According to Example 4, the apparatus of Example 1 or Example 2 may further comprise a photon source configured to input pump photons into the non-linear photonic element.

According to Example 5, in the apparatus of Example 3 or Example 4 the apparatus may comprise a laser and at least one further non-linear photonic element.

According to Example 6, in an apparatus according to Example 5, a central wavelength of the laser may be a telecommunications wavelength. Advantageously, by using a laser having a central wavelength in the telecoms band, the apparatus may be easily compatible with other technologies.

According to Example 7, in an apparatus according to Example 5 or Example 6, the at least one further non-linear photonic element may be configured to receive a first light pulse comprising light output from the laser. The at least one further non-linear photonic element may be configured to convert the first light pulse into a second light pulse having a different central wavelength than that of the first light pulse.

According to Example 8, in an apparatus according to Example 7, the first light pulse may have a central wavelength of between 1300 nanometres and 1600 nanometres, and the second light pulse may have a central wavelength of between 650 nanometres and 800 nanometres. Advantageously, light having a central wavelength of between 650 nanometres and 800 nanometres is in the near infra-red and is readily detectable on room temperature single photon detectors. Further advantageously, light having a central wavelength of between 650 nanometres and 800 nanometres is compatible with atomic memories (Example 29 below) comprising Rubidium.

According to Example 9, in an apparatus according to Example 8, the first light pulse may have a central wavelength of approximately 1552 nanometres and the second light pulse may have a wavelength of approximately 776 nanometres. Advantageously, a wavelength of approximately 776 nanometres is compatible with atomic memories (Example 29 below) comprising Rubidium.

According to Example 10, in an apparatus according to any of Examples 1 to 9, the non-linear photonic element may comprise a cavity parametric down conversion source. A cavity parametric down conversion source is advantageously capable of producing narrowband photons, which is difficult to do with other photon sources.

According to Example 11, in an apparatus according to any of Examples 1 to 10, the detector arrangement may comprise a first plurality of detectors for receiving the signal photon, and a second plurality of detectors for receiving the idler photon. Advantageously, the signal and idler photons may be separated out into different optical paths, making them more easily distinguishable from one another. This enables one of the signal/idler photon to be detected without measuring the other of the pair.

According to Example 12, an apparatus according to Example 11 may further comprise a set of one or more photonic splitters configured to receive the signal or idler photon output along the optical path, and output the received signal or idler photon towards the detector arrangement.

According to Example 13, an apparatus according to Example 11 or Example 12 may further comprise a set of one or more photonic splitters configured to receive the said other signal or idler photon, and output the received other signal or idler photon towards the detector arrangement. Amongst many other advantages, by utilising photonic splitters, the apparatus is advantageously able to perform photon number resolving measurements.

According to Example 14, in an apparatus according to Example 12 or Example 13, any one or more of the sets of photonic splitters may comprise a plurality of photonic splitters photonically linked together and configured to receive input light and output light into at least three detectors of the detector arrangement. Advantageously, photons may be separated based on their polarisation states.

According to Example 15, in an apparatus according to Example 14, the plurality of photonic splitters may be arranged such that the signal or idler photon, received by the set, has a substantially equal probability of being detected by the said at least three detectors.

According to Example 16, in an apparatus according to any of Examples 12 to 15, any one or more of the sets of photonic splitters may comprise a polarizing beam splitter (PBS).

According to Example 17, an apparatus according to Example 16 may further comprise a controllable polarization beam rotator for controlling the polarization of the photons entering the polarizing beam splitter. Advantageously, the use of a controllable polarization rotator enables the user to control which measurement is made by the detectors.

According to Example 18, in an apparatus according to any of Examples 1 to 17, the module may comprise a looped path for guiding photons. The module may further comprise a photonic element configured to controllably couple light into and out of the looped path based on the one or more control signals. The module may be configured to receive at least one of the signal or idler photons of the pair, at least partially couple one of the signal or idler photons into the looped path, and at least partially couple the said signal or idler photon out of the looped path along the optical path towards at least one of the detectors.

Example 18 as dependent on Example 10 is particularly advantageous. A cavity parametric down conversion source is advantageously capable of producing narrowband photons, which is difficult to do with other photon sources. Non-cavity parametric down conversion sources typically produce short photons that are difficult to overlap in the photonic element. In contrast, a narrowband photon produced by a cavity parametric down conversion source is more elongated in time, meaning that is easier to interfere two photons (one from the looped path and one from the non-linear element) in the photonic element. This makes it easier to generate more complicated quantum states, which is advantageous for e.g. developing cluster states (as per FIGS. 11A-11D) or for boson sampling.

According to Example 19, in an apparatus according to Example 18, at least one detector of the detector arrangement may be configured, upon receiving and detecting the signal or idler photon output from the looped path, to output a detection signal. The apparatus may be configured to output a further signal and idler photon pair from the non-linear photonic element. The apparatus may be further configured to control, based on at least one of the at least one control signals, the at least partial coupling of one of the further signal or idler photons into the looped path. The apparatus may be further configured to control, based on at least one of the at least one control signals, the at least partial coupling of one of the further signal or idler photons out of the looped path. The at least one control signal may be based on the detection signal.

According to Example 20, in an apparatus according to Example 18 or Example 19, the looped path may have a round-trip time that is a multiple of the time between generation of consecutive signal and idler photon pairs. Advantageously, an apparatus according to Example 20 is able to operate on bunches of photons in each time period. For example, in many circumstances the speed at which the photonic element can be adapted (for example 1 MHz) is often slower than the speed at which the detectors can be operated (for example 10 MHz), meaning that the speed of switching the photonic element acts as a bottleneck on the apparatus. For certain use cases, in particular boson sampling, it is desired to make multiple measurements for the same photonic element settings in order to sample a photonic wavefunction. By providing a looped path that has a round-trip time that is a multiple of the time between generation of consecutive signal and idler photon pairs, a first train of, for example, ten photons can be coupled into the looped path in order to interfere with a second (subsequent) train of, for example, ten photons. Accordingly, the first photon of the first train can interfere with the first photon of the second train, the second photon of the first train can interfere with the second photon of the second train, and so on. The detectors, able to refresh at for example ten times than the photonic element, are accordingly able to sample the photonic wavefunction more quickly.

According to Example 21, in an apparatus according to Example 20, the time between generation of consecutive signal and idler photons may be greater than or equal to an effective deadtime of the detector arrangement. Advantageously, the effective deadtime of the detector arrangement need not be a bottleneck on the speed at which the apparatus may operate.

According to Example 22, an apparatus according to Example 18 or Example 19 may further comprise a controller configured to change the output rate of photon pairs to substantially match the round-trip time of the looped path. Advantageously, consecutively output signal photons may coincide on the photonic element at the same time, enabling interference effects. Such interference effects are particularly useful in, for example, boson sampling operations.

According to Example 23, in an apparatus according to any of Examples 18 to 22, the photonic element may comprise a reconfigurable beam splitter having a reconfigurable effective reflection coefficient. Advantageously, a reconfigurable beam splitter can be used to tune the interference between a first photon coupled into the looped path and a (subsequent) second photon output from the non-linear photonic element. With such an effect, entangled chains of photons can be used. Furthermore, a reconfigurable beam splitter enables certain computing paradigms, such as boson sampling. The photonic element may comprise, for example, a tunable Mach-Zehnder interferometer or a Pockels cell.

According to Example 24, in an apparatus according to Example 23, the one or more control signals may be indicative of an effective reflection coefficient for the photonic element.

According to Example 25, in an apparatus according to any of Examples 18 to 24, the looped path may comprise an optical fibre.

According to Example 26, in an apparatus according to any of Examples 1 to 17, the module may comprise a looped path for guiding photons, the looped path comprising a first polarization rotator for controllably rotating a polarization of light into a superposition of a first polarization state having a first polarization and a second polarization state having a second polarization; and a polarizing photonic element for coupling light having the first polarization into the looped path and for coupling light having the second polarization out of the looped path. The module may be configured to: receive at least one of the signal or idler photons of the pair; at least partially couple one of the signal or idler photons into the looped path; and at least partially couple the said signal or idler photon out of the looped path along the optical path towards at least one of the detectors.

According to Example 27, an apparatus according to Example 26 may further comprise a second polarization rotator for controllably rotating a polarization of a signal or idler photon received from the non-linear photonic element into a superposition of a first polarization state having the first polarization and a second polarization state having the second polarization, and outputting the rotated photon to the photonic element. Advantageously, the second polarization rotator can be controlled to select what polarization of light reaches the photonic element. The second polarization rotator can be used to align a photon with a polarization to be coupled into the looped path, can be used to align a photon with a polarization to be coupled along the optical path towards the detector arrangement, or can be used to generate a quantum superposition of the two polarization states.

According to Example 28, in an apparatus according to any of Examples 1 to 27, the module may comprise a wavelength converter and a wavelength-selective splitter/combiner. For example, the wavelength-selective splitter/combiner may comprise a wavelength-division multiplexer or a fiber Bragg grating.

According to Example 29, in an apparatus according to any of Examples 1 to 17, the module may comprise a photonic memory. Advantageously, photonic memories can enable light to be stored for a more controllable amount of time, which can be useful in many different use cases.

Example 29 as dependent on Example 8 or Example 9 is particularly advantageous. Photonic memories may optionally store quantum states by manipulating the energy levels of Rubidium. Light having a wavelength in the region of 650 nm-800 nm, and optionally in the range of 770-780 nm is particularly useful for interacting with Rubidium transition levels.

Each feature disclosed in this specification (including any accompanying claims, abstract or drawings), may be replaced by alternative features serving the same, equivalent or similar purpose, unless expressly stated otherwise. Thus, unless expressly stated otherwise, each feature disclosed is one example only of a generic series of equivalent or similar features.

Each feature disclosed in this specification (including any claims, abstract or drawings), may be replaced by alternative features serving the same, equivalent or similar purpose, unless expressly stated otherwise. Thus, unless expressly stated otherwise, each feature disclosed is one example only of a generic series of equivalent or similar features.

The disclosure is not restricted to the details of any foregoing embodiments. The disclosure extends to any novel one, or any novel combination, of the features disclosed in this specification (including any accompanying claims, abstract and drawings), or to any novel one, or any novel combination, of the steps of any method or process so disclosed. The claims should not be construed to cover merely the foregoing embodiments, but also any embodiments which fall within the scope of the claims.

What is claimed is:

1. An apparatus comprising:
a cavity parametric down conversion source configured to output a photon pair comprising a signal photon and an idler photon;
a detector arrangement comprising one or more detectors configured to detect light; and
a module comprising:
a looped path configured to guide photons; and
a photonic element configured to controllably couple light into and out of the looped path based on receiving one or more control signals, wherein the photonic element comprises a reconfigurable beam splitter having a reconfigurable effective reflection coefficient;
wherein the module is configured to:
receive at least one of the signal photon or the idler photon;
at least partially couple one of the signal photon or the idler photon into the looped path; and
at least partially couple said one of the signal photon or the idler photon out of the looped path and along an optical path towards a detector of the detector arrangement;
wherein the apparatus is configured to direct the other of the signal photon or the idler photon towards the detector arrangement.

2. The apparatus of claim 1, further configured to use a signal output from at least one detector of the detector arrangement to control a rate of photon pair generation from the cavity parametric down conversion source.

3. The apparatus of claim 2, further comprising a pulse source system configured to input pump photons into the cavity parametric down conversion source;
wherein controlling the rate of photon pair generation comprises changing a rate of output pump light pulses from the pulse source system.

4. The apparatus of claim 3, wherein the pulse source system comprises a laser and a non-linear photonic element.

5. The apparatus of claim 4, wherein a central wavelength of the laser is a telecommunications wavelength.

6. The apparatus of claim 4, wherein the non-linear photonic element is configured to:
receive a first light pulse comprising light output from the laser;
convert the first light pulse into a second light pulse having a different central wavelength than that of the first light pulse.

7. The apparatus of claim 6, wherein the first light pulse has a central wavelength of between 1300 nm and 1600 nm, and wherein the second light pulse has a central wavelength of between 650 nm and 800 nm.

8. The apparatus of claim 7, wherein the first light pulse has the central wavelength of 1552 nm, and wherein the second light pulse has the central wavelength of 776 nm.

9. The apparatus of claim 1, further comprising:
a pulse source system configured to input pump photons into the cavity parametric down conversion source.

10. The apparatus of claim 1,
wherein at least one detector of the detector arrangement is configured, upon receiving and detecting the signal photon or the idler photon output from the looped path, to output a detection signal; and
wherein the apparatus is configured to:
output a further photon pair comprising a second signal photon and a second idler photon from the cavity parametric down conversion source; and
control, based on at least one of the one or more control signals, at least one of:
a. at least partial coupling of one of the second signal photon or the second idler photon into the looped path; or
b. at least partial coupling of one of the second signal photon or the second idler photon out of the looped path;
wherein the at least one of the one or more control signals is based on the detection signal.

11. The apparatus of claim 1, wherein the looped path has a round-trip time that is a multiple of a time between generation of consecutive signal and idler photon pairs.

12. The apparatus of claim 11, wherein the time between generation of consecutive signal and idler photon pairs is greater than or equal to an effective deadtime of the detector arrangement.

13. The apparatus of claim 1, wherein the one or more control signals are indicative of an effective reflection coefficient for the reconfigurable beam splitter.

14. The apparatus of claim 1, wherein the looped path comprises an optical fibre.

15. The apparatus of claim 1, wherein:
the cavity parametric down conversion source is further configured to output a second photon pair comprising a second signal photon and a second idler photon;
the module is further configured to:
receive the second signal photon;
when the module receives the signal photon and at least partially couples the signal photon into the looped path, interfere the signal photon with the second signal photon to produce an interfered superposition of the signal photon and the second signal photon; and
at least partially couple the interfered superposition out of the looped path and along the optical path towards the detector of the detector arrangement; and
wherein the apparatus is further configured to direct the idler photon and the second idler photon towards the detector arrangement.

16. An apparatus comprising:
a cavity parametric down conversion source configured to output a photon pair comprising a signal photon and an idler photon;
a detector arrangement comprising one or more detectors configured to detect light, wherein the detector arrangement comprises:
a first plurality of detectors configured to receive the signal photon; and
a second plurality of detectors configured to receive the idler photon; and a module comprising:
- a looped path configured to guide photons; and
- a photonic element configured to controllably couple light into and out of the looped path based on receiving one or more control signals;

wherein the module is configured to:
- receive at least one of the signal photon or the idler photon;
- at least partially couple one of the signal photon or the idler photon into the looped path; and
- at least partially couple said one of the signal photon or the idler photon out of the looped path and along an optical path towards a detector of the detector arrangement;

wherein the apparatus is configured to direct the other of the signal photon or the idler photon towards the detector arrangement.

17. The apparatus of claim 16, further comprising a set of one or more photonic splitters configured to:
- receive the signal photon or the idler photon output along the optical path; and
- output the received signal photon or idler photon towards the detector arrangement.

18. The apparatus of claim 17, wherein the set of one or more photonic splitters comprises a plurality of photonic splitters photonically linked together and configured to receive input light and to direct output light into at least three detectors of the detector arrangement.

19. The apparatus of claim 17, wherein a photonic splitter of the set of one or more photonic splitters comprises a polarizing beam splitter.

20. An apparatus comprising:
- a cavity parametric down conversion source configured to output a photon pair comprising a signal photon and an idler photon;
- a detector arrangement comprising one or more detectors configured to detect light;
- a module comprising:
  - a looped path configured to guide photons; and
  - a photonic element configured to controllably couple light into and out of the looped path based on receiving one or more control signals; and
- a controller configured to change an output rate of photon pairs to substantially match a round-trip time of the looped path;

wherein the module is configured to:
- receive at least one of the signal photon or the idler photon;
- at least partially couple one of the signal photon or the idler photon into the looped path; and
- at least partially couple said one of the signal photon or the idler photon out of the looped path and along an optical path towards a detector of the detector arrangement;

wherein the apparatus is configured to direct the other of the signal photon or the idler photon towards the detector arrangement.

* * * * *